United States Patent [19]
Saitoh et al.

[11] Patent Number: 6,001,667
[45] Date of Patent: *Dec. 14, 1999

[54] METHOD OF MANUFACTURING A SEMICONDUCTOR DETECTOR FOR DETECTING LIGHT AND RADIATION

[75] Inventors: Yutaka Saitoh; Masahiro Inoue; Junko Yamanaka; Hirokazu Ikeda, all of Chiba, Japan

[73] Assignee: Seiko Instruments Inc., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/553,565

[22] PCT Filed: Mar. 27, 1995

[86] PCT No.: PCT/JP95/00559

§ 371 Date: Jun. 3, 1996

§ 102(e) Date: Jun. 3, 1996

[87] PCT Pub. No.: WO95/26573

PCT Pub. Date: Oct. 5, 1995

[30] Foreign Application Priority Data

Mar. 28, 1994 [JP] Japan .................................. 6-057368

[51] Int. Cl.$^6$ .................................. H01L 27/14

[52] U.S. Cl. .................................. 438/57; 438/59; 438/89; 438/455; 438/459

[58] Field of Search .................................. 257/292, 448, 257/457, 459, 461, 462, 431; 438/48, 57, 59, 73, 89, 455, 459

[56] References Cited

U.S. PATENT DOCUMENTS 5,324,678  6/1994  Kusunoki .
5,541,122  7/1996  Tu et al. .
5,608,204  3/1997  Hofflinger et al. ..................... 257/448

*Primary Examiner*—Chandra Chaudhari
*Assistant Examiner*—Keith Christianson
*Attorney, Agent, or Firm*—Adams & Wilks

[57] ABSTRACT

A method of manufacturing a semiconductor detector for detecting light and radiation comprises the steps of providing a first semiconductor substrate of a first conductivity type, attaching a second substrate to the first semiconductor substrate through an insulating film, grinding the first semiconductor substrate from a surface thereof to a predetermined thickness, forming a MOS transistor on the ground surface of the first semiconductor substrate, removing the second substrate, and forming electrodes on the first semiconductor substrate for forming a depletion layer.

6 Claims, 37 Drawing Sheets

FIG. 6

| parameters of the physical quantity | present invention |
|---|---|
| d (thickness of the depletion layer) | 300 μm |
| Ad (side of the PMOS pixel) | 200×200 μm |
| $N_A$ (doping concentration of the source region) | $5×10^{19} cm^{-3}$ |
| $N_D$ (doping concentration of the substrate (n-well) | $1×10^{16} cm^{-3}$ |
| W/L (PMOS transistor) | 4×4 μm |
| $A_J$ (side of source region) | 4×4 μm |
| $t_c$ (gate insulating film thickness of PMOS transistor) | 540nm |
| μs (carrier nobility) | 120cm²/Vsec |
| $W_{WELL}$ (N-well region) | 100×100 μm |

FIG. 7

| parameters of the electrical characteristics | present invention |
|---|---|
| $C_D = AdCd$ | 14.0fF |
| $C_G = WLCox$ | 1.02fF |
| $C_J = AJCjo$ | 4.85fF |
| $C_S = WLC_{SUB}$ | 5.56fF |
| $C_B = CD+CJ+CS$ | 24.4fF |
| Cox | 63.9F/ μm² |
| $V_{bi}$ | 0.92V |
| $\phi Fn$ | -0.35V |
| $L_D$ | 41.3NM |
| $V_{TH}$ | -8.27V |
| $V_{GS}$ | -9.0V |
| gm | 0.56 μS |
| $g_{sub}$ | 3.03 μS |
| Id(DC) | 200nA |
| $I_L$ | 1pA/pixel |

FIG. 8

| parameters of the circuit characteristics | present invention |
|---|---|
| $R_B$ (N-well bias resistance) | $10G\Omega$ (typ) |
| $\tau = R_B C_B$ (total time constant) | $250\mu sec$ |
| $\tau_a$ =(read amplifier first transition time) | $1\mu sec$ |
| $\tau_s$ (sampling interval) | $1\mu sec$ |
| $t_o$ (derivative action time constant) | $150\mu sec$ |
| gM (amplification of preamplifier) | 1.5mS |
| $I_L$ (leakage current) | 1pA/pixel |
| Np (number of pixel) | 25b |
| Ro | $1M\Omega$ |
| Co | 0.15pF |
| amplification | 18.6 |
| non-linear characteristic | 11.2% |
| noise current transmission | 388 |
| Vds | -5V |
| Vs | 0V |
| $V_{well}$ | 0V |
| $V_{Bias}$ | -80V |

FIG. 15
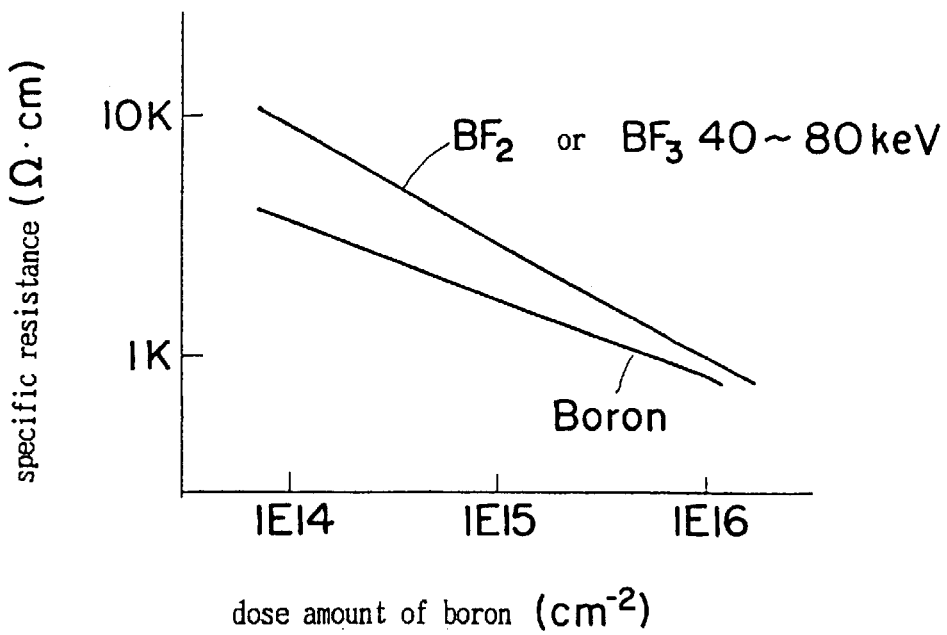
FIG. 16  d : direction of the substrate thickness
e : traverse direction
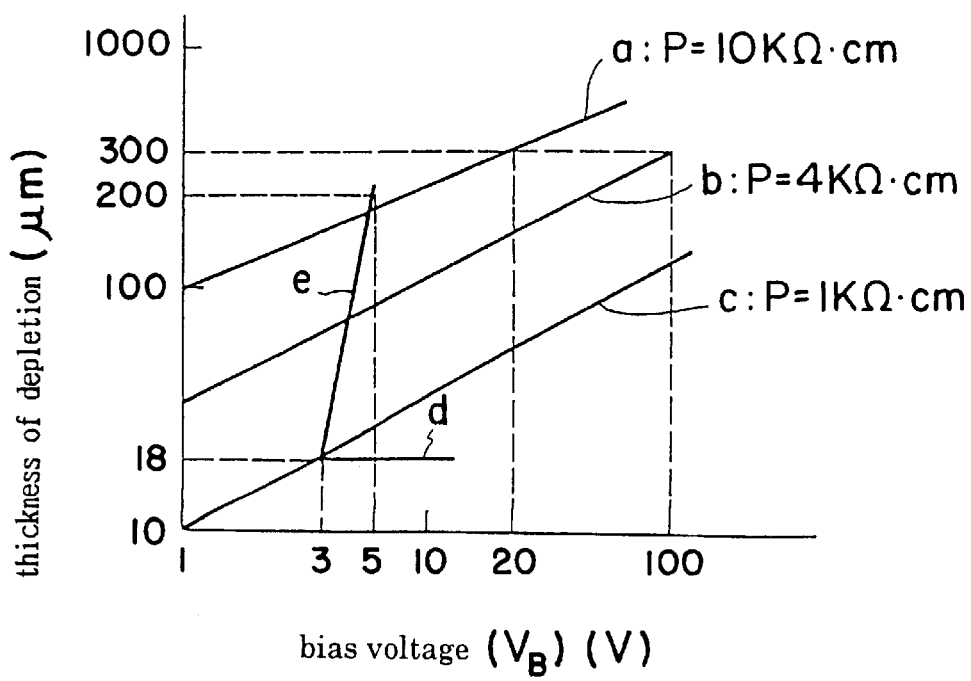

FIG. 17(a)
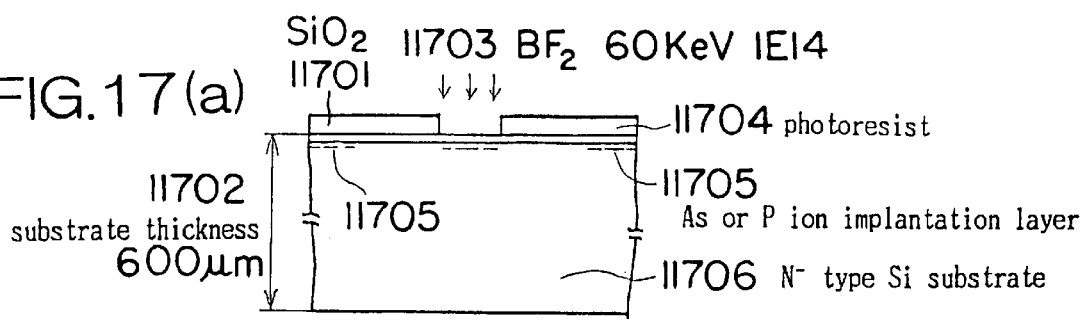
FIG. 17(b)
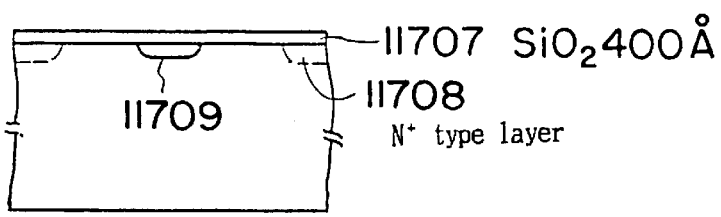
FIG. 17(c)
FIG. 17(d)
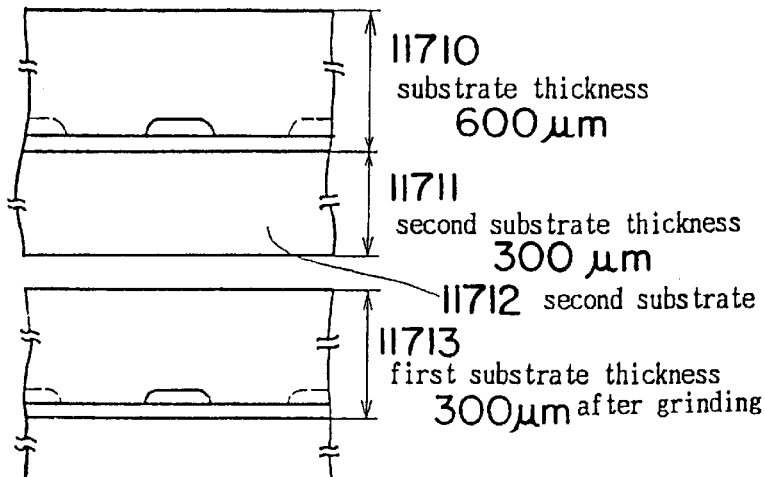
FIG. 17(e)
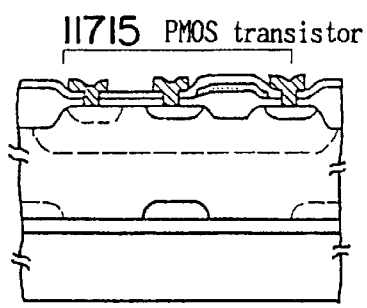
FIG. 17(f)
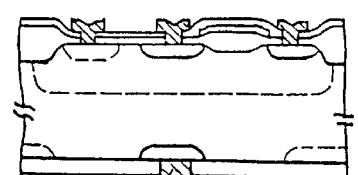
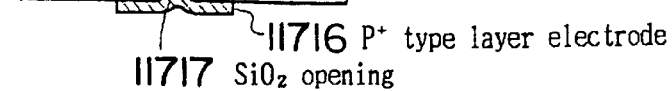

PRIOR ART
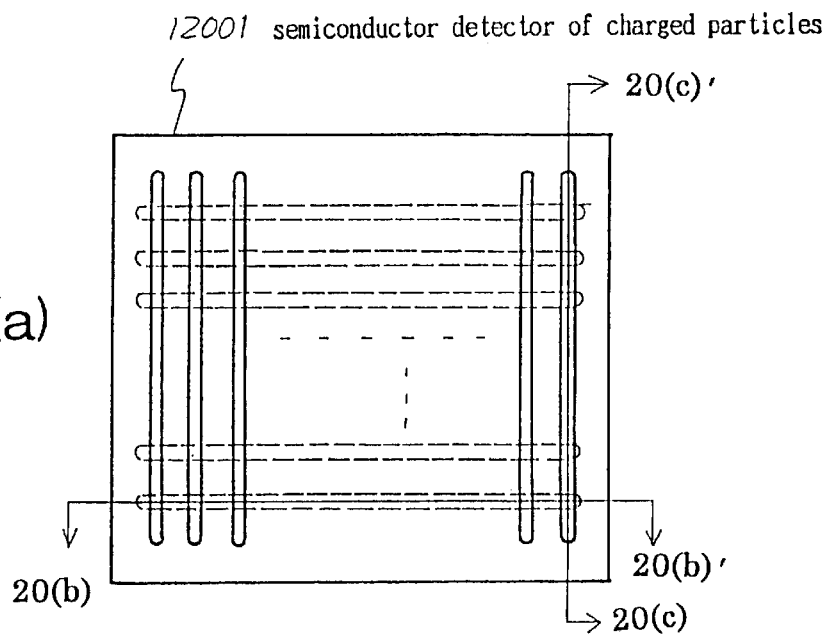
FIG.20(a)
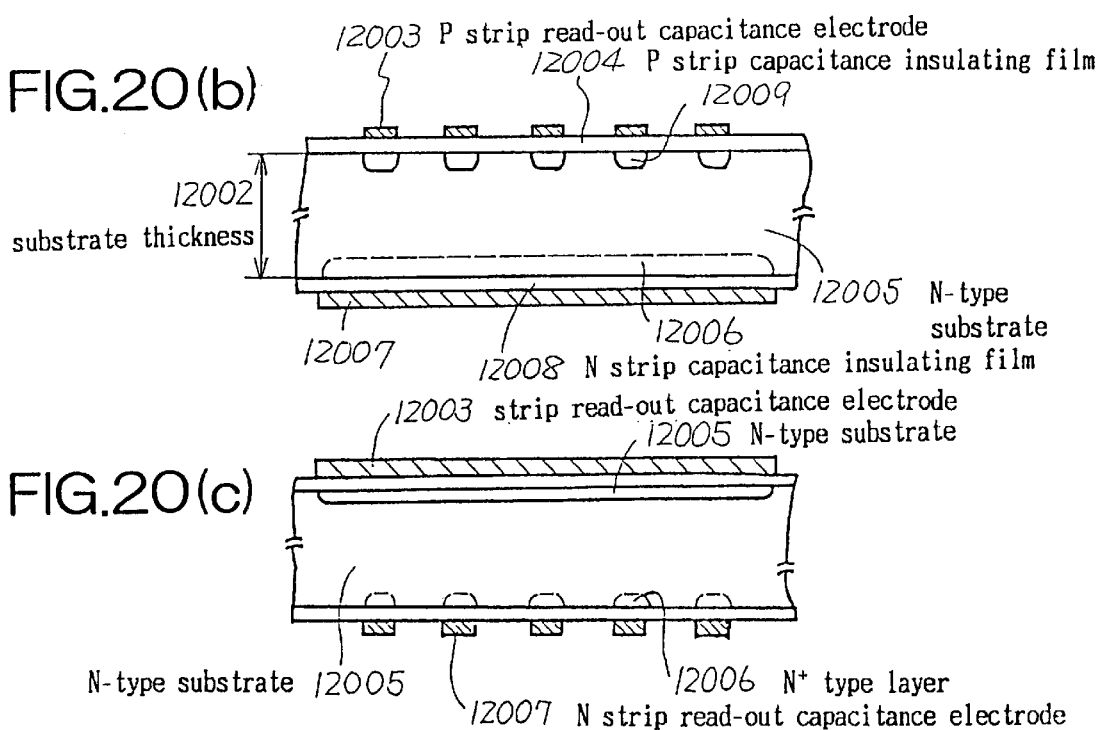

METHOD OF MANUFACTURING A SEMICONDUCTOR DETECTOR FOR DETECTING LIGHT AND RADIATION

This invention relates to semiconductor detection devices which convert light and radiation into electrical signals and to the manufacturing method of the same.

BACKGROUND OF THE INVENTION

The simple expression of "detection" herein used is employed to mean conversion of light and radiation to electrical signals. The detection of light utilizes the photoelectric effect in which light of 300 nm to several μm wavelength changes into electrical signals in semiconductor. The detection of radiation utilizes the mechanism in which ionizing radiation such as X-ray and r ray and charged particles generate electron-hole pair in semiconductor to produce electrical signals therefrom. A plurality of detection semiconductor arranged in one plane can detect two-dimensional information (surface resolution). FIG. 20 shows one example of the conventional semiconductor detector of charged particles. FIG. 20 (a) is a diagrammatic plan view of the detector, FIG. 2 (b) is a diagrammatic section view on line A—A', and FIG. 2 (c) is a diagrammatic section view on line B—B'. In the Figures, the numeral 12001 indicates a semiconductor detector of charged particles, 12002 indicates the substrate thickness, 12003 indicates a p strip read-out capacitance electrode, 12004 indicates a p strip capacitance insulating film consisting of a capacitance insulating film, 12005 indicates an N– type Si (silicon) semiconductor substrate, 12006 indicates an n strip consisting of N+ type impurity layer with doping concentration of about the 19th to 20th power, 12007 indicates an n strip read-out capacitance electrode, 12008 indicates an n strip capacitance insulating film, and 12009 is a p strip consisting of P+ type impurity layer with doping concentration of around the 19th power of 10.

As is apparent from FIG. 20, a plurality of p strips 12009 are arranged in parallel in the shape of strip on the front side of the semiconductor substrate 12005. On the back side of the semiconductor substrate 12005, a plurality of n strips 12006 are arranged in parallel in such a direction as to cross the above mentioned p strips. On each p strip 12009 there are provide a p strip capacitance insulating film 12004 and a p strip read-out capacitance electrode 12003, while an n strip capacitance insulating film 12008 and an n strip read-out capacitance electrode 12007 are provided on each n strip.

FIG. 21 is a schematic circuit diagram showing a detection part of FIG. 20. 12001 represented with phantom line indicates an IC chip on which semiconductor detector of charged particles is formed. 12104 indicates a crossing part of the above mentioned p strip 12009 and the n strip 12006, at which a pn junction is formed to construct a detection diode which functions as detection part of charged particles. 12102 indicates a capacitance $C_G$ formed at both ends of the diode 12104, which constitutes a read-out capacitance. 12103 indicates a read-out amplifier and 12105 indicates the ground GND. 12106 indicates a bias resistance and 12101 indicates a bias power supply $V_B$. Each detection diode 12104 is electrically connected to the bias power supply $V_B$ 12101 through the bias resistance 12106.

When bias power supply VB is applied, depletion layer is extended from the boundary of the reverse-biased pn junction in the direction of the substrate thickness 12002. The layer can be expanded to almost the same thickness of the substrate. If charges particles fall on the depletion layer, electron-hole pairs are generated inside the depletion layer, signals are produced through the read-out capacitance by an external circuit, such as a read-out amplifier 12103 in a quantity that is a measure of the incident charged particles. At this time, as the p strips on the front side and the n strips on the back side cross to form a detection diode 12104 at each crossing point as is described above, the output of the diode shows the position and the quantity of the incident charged particles. Such detector is a semiconductor device intended for detecting charged particles in real time (constantly).

As semiconductor devices for detecting lights, there are those using pn junctions or npn transistors arranged two-dimensionally as detection element (the examples of such devices are not shown in the drawings), other than CCD. In such devices, the signals are processed by selecting each elements in time division system.

Conventional semiconductor detectors with the structures described above have the following problems:

1. As structures such as capacitance and wiring have to be constructed on both sides of the semiconductor substrate, many process steps are required and fabrication process is complicated. Moreover a frequent occurrence of flaw on the surface due to the complicated double-side process makes the improvement in yield difficult and therefore increases the manufacturing cost.

2. The relationship between the thickness of the depletion layer which affects the detection and the quantity of the material which causes the multiple scattering limits the thickness of the semiconductor substrate used; in general, a thickness of 200 to 400 μm is often employed, while a thicker substrate of 500 to 650 μm cannot be used. This means that in semiconductor wafer process, state-of the art process technologies such as high-cleanness and high-resolution process cannot be used, because either of such process technologies uses a 6-inch or wider diameter which, if given a thickness of less than 500 μm, has a high possibility to break and therefore is difficult to fabricate in the process.

3. For the detection of lights as well as for the detection of the charged particles, if pn junction only is used, the magnitude of the signal is so small that it is difficult to obtain a S/N (signal to noise) ratio high enough in relation to other capacitance and resistance to be added.

4. For the detection of lights as well as for the detection of the charged particles, if npn (or pnp) transistor structure is utilized, the amplification of the signal is performed by the detection element itself, therefore while the signal of large magnitude can be obtained, measurement (sampling) in high-speed (more than several MHz) is difficult due to the large junction capacitance and the long storage time of the minority carriers in the base region.

It is therefore an object of the present invention to find a novel principle to solve the problems above and to provide a novel high-performance semiconductor detector of light and radiation and the manufacturing method of the same based on this principle.

DESCRIPTION OF THE INVENTION

The principle of the present invention and the main measures to solve the above problems will be hereinafter described.

The operation principle of the present invention is to provide a pn junction electrode in a semiconductor substrate in which a MOS transistor is formed, and to use the depletion layer generated by the pn junction as detection part. Incident light or radiation into the depletion layer causes the change in impedance according to the amount of the light or the radiation. The substrate potential of the MOS transistor is thereby changed, which involves change in drain current as a function of the incident light or radiation amount. The present invention utilizes this change in drain current as read-out detection output.

A first measure utilizing this operation principle is a measure whereby the detection element is a MOS transistor having a substrate back bias. Our description hereinafter will be in terms of a p-channel type MOS transistor.

A second measure is a measure whereby, if the substrate is N− type, an n-well with a higher concentration than the N− type substrate is formed and the above mentioned PMOS transistor is constructed therein. (The conductivity type of the impurities is the opposite if NMOS is used in the following description.)

A third measure is a measure whereby a P+ type layer is provided for forming a depletion layer, with the P+ type layer being constructed on the same side of the semiconductor substrate in which the PMOS is formed. Furthermore the P+ type layer is arranged with a distance of more than the desired thickness of the extended depletion layer from the n-well.

A fourth measure is a measure whereby a P+ type layer is provided for forming a depletion layer, with the P+ type layer being constructed on the opposite side of the semiconductor substrate. Furthermore the P+ type layer has a larger area than the n-well region of the PMOS. If a plurality of the P+ layers are arranged, the P+ layer is formed with an interval smaller than the desired thickness of the expanded depletion layer from adjacent P+ type layers.

A fifth measure is a measure whereby a MOS diode is provided for forming a depletion layer, with the diode being constructed on the same side of the semiconductor substrate on which the PMOS is formed.

A sixth measure is a measure whereby a MOS diode is provided for forming a depletion layer, with the diode being constructed on the opposite surface of the semiconductor on which the PMOS is formed.

A seventh measure is a measure whereby the PMOS is arranged in the shape of concentric circle with the source domain at the center.

An eighth measure is a measure whereby the semiconductor substrate used has a thin-film semiconductor (known in the art as SOI substrate, or Silicon On Insulator) provided on the base substrate through an insulating film layer, with the thin-film semiconductor layer being thinner than the depletion layer extended by a predetermined bias voltage applied to form the depletion layer.

An ninth measure is a measure whereby a plurality of the PMOSs are arranged in the same substrate. It is more preferable to provide P± type between the PMOSs.

A tenth measure is a measure whereby a manufacturing method is employed which comprises at least a process in which a P+ type layer is formed in the first semiconductor substrate, a process in which the layer is subjected to oxidation and diffusion, a process in which the second substrate is adhered to the surface on which the P+ type layer is formed, a process in which the first semiconductor substrate is subjected to grinding, a process in which the above-described PMOS is formed on thus-ground surface, a process in which the second substrate is removed, and a process in which electrodes are formed on the P+ type layer.

A eleventh measure is a measure whereby a manufacturing method is employed which at least comprises a process by which ions are implanted in a dose amount of $5E14/cm^2$ or less using $BF_2$ or $BF_3$ at the energy of 40 to 80 keV to form the P+ type layer.

A twelfth measure is a measure whereby a manufacturing method is employed which comprises at least a process in which the second substrate is adhered to the first semiconductor substrate through an insulating film, a process in which the first semiconductor substrate is subjected to grinding, a process in which PMOS is formed on the thus-ground surface, a process in which the second substrate is removed, and a process in which electrodes of MOS diode for the formation of depletion layer are formed.

A thirteenth measure is a measure whereby an element of resistance component for bias is formed adjacent to the above-described PMOS in the same semiconductor substrate.

A fourteenth measure is a measure whereby a signal processing circuit connecting to the PMOS is formed in the same semiconductor substrate. Furthermore, in regard to the PMOS, a structure including a bias control circuit and a power supply control circuit is constructed.

By adopting the above measures, the following effects are obtained:

By adopting the first measure and using PMOS, amplification effect of signals is obtained. Also, because PMOS is used instead of minority carrier elements such as npn transistor, high-speed measurement is allowed.

By adopting the second measure, the n-well substrate with a higher concentration generates a larger substrate bias effect.

By adopting the third measure, as the P+ type layer for forming a depletion layer is provided on the same side of the PMOS, a single-side semiconductor detector of charged particles is achieved.

By adopting the fourth measure, the P+ type layer for forming a depletion layer is provided on the opposite side of the PMOS, allowing reduction in area of the semiconductor detector (chip size) as well as higher-density multiple arrangement on the PMOS side.

By adopting the fifth measure, the depletion layer is formed using a MOS diode, allowing reduction in leak current which causes the noise.

By adopting the sixth measure, as the MOS diode for forming the depletion layer is provided on the opposite side of the PMOS, reduction in chip side of the semiconductor detector itself as well as a higher-density multiple arrangement on the PMOS side are allowed.

By adopting the seventh measure, an effect is obtained whereby detection with uniformity over the surface is allowed.

By adopting the eighth measure, the depletion layer extends in the direction of the depth of the thin semiconductor layer and then radically extends in the traverse direction to cover the desired region, allowing detection with a lower voltage.

By adopting the ninth measure, a semiconductor detector with a two-dimensional surface resolution is achieved. If a P± type is provided between the PMOSs, there is a effect on the division of signals for the detection of charged particles.

By adopting the tenth measure, a semiconductor detector with a desired thickness of the depletion layer (a thickness such as 300 μm, that is thinner than that of a large wafer of 600-μm diameter) can be manufactured on a large-diameter wafer.

By adopting the eleventh measure, a semiconductor substrate with a specific resistance of 4 kΩcm or more can be provided with a good controllability.

By adopting the twelfth measure, a semiconductor detector with a desired thickness of the depletion layer (a thickness such as 300 μm, that is thinner than that of a large wafer of 600-μm diameter) can be manufactured in a large area, i.e., on a large-diameter wafer.

By adopting the thirteenth measure, the signal processing circuit can be simplified.

By adopting the fourteenth measure, a detection element and the signal processing circuit can be provided on a single-chip semiconductor device.

BRIEF DESCRIPTION OF THE DRAWINGS

FIG. 6 is a table showing parameters of the physical quantity of the PMOS transistor of the present invention. FIG. 7 is a table showing parameters of the electrical characteristics of the PMOS transistor pixels according to the present invention. FIG. 8 is a table showing parameters of the circuit characteristics of the detection elements of charged particles of the PMOS transistor pixels according to the present invention. FIG. 15 is a graph showing the dose amount and the specific resistance of the semiconductor device of the present invention. FIG. 16 is a graph showing the bias voltage and the thickness of the depletion layer of the present invention. FIG. 17($a$)–17($f$) is a section view showing an example of the manufacturing process steps of the present invention. FIG. 20($a$)–20($c$) is a diagram showing the conventional semiconductor device for the detection of charged particles.

PREFERRED EMBODIMENTS OF THE INVENTION

Embodiments

Figure 1:
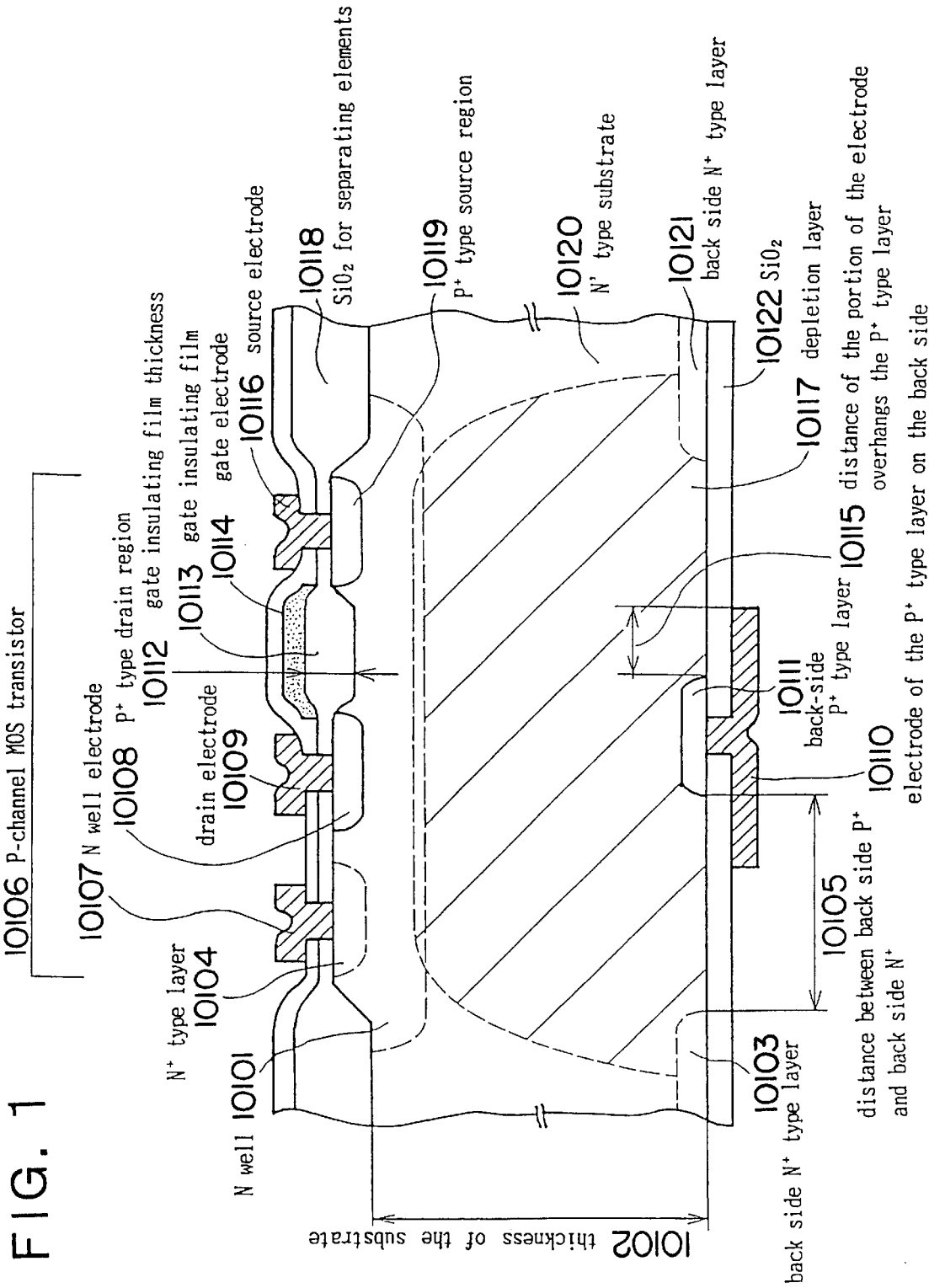
FIG. 1 is a section view showing a first embodiment of the present invention.

Preferred embodiments of the present invention will be hereinafter described in detail referring to the drawings.

FIG. 1 is a section view showing the first embodiment of the semiconductor detector of charged particles according to present invention. The numeral 10120 indicates an N– substrate with a specific resistance of 6 kΩcm. 10102 indicates the thickness d of the substrate, which is 300 μm. 10101 is an n-well which is formed by phosphorous ion implementation at 150 keV with a dose amount of 6E 12/cm². 10108 indicates the drain region, and 10119 indicates the source region. Either of these regions is a P+ type layer which is formed by boron ion implementation at 30 keV with a dose amount of 5E 15/cm², and these regions have a drain electrode 10109 and a source electrode 10116 respectively. 10107 indicates an n-well electrode. 10104 indicates an N+ type layer for providing an ohmic contact with the n-well, which is formed by phosphorous ion implementation at 40 keV with a dose amount of 6 E 15/cm². 10113 indicates a gate insulating film having a film thickness 10112 of 540 nm. 10114 is a gate electrode formed by Poly Si. 10118 indicates SiO2 for separating elements, having a film thickness of 1 $\mu$m and surrounding the n-well.

The specific resistance (concentration) of the substrate, the dose amount of the n-well and the film thickness of the gate insulating film are the important parameters of the present invention, and they affects the characteristics of the semiconductor detector of the present invention. The film thickness of the gate insulating film is preferably thinner than SiO2 for separating elements 10118, because otherwise Vth of the separation region cannot be held due to bias. 10117 indicates the depletion layer, which extends into the back-side P+ type layer 10111 depending on the concentration. Further description will be omitted in the drawings. In this manner a p-channel MOS transistor 10106 is formed as detection element.

Next the back side of the substrate will be described. 10111 indicates a P+ type layer on the back side, which is provided to form the depletion layer 10117 by applying reverse bias voltage, which is formed at 2E14/cm² and 40 keV of BF$_2$, and which forms a pn junction with the above described N+ substrate 10120. 10122 indicates an SiO2 film formed on the back side. 10110 indicates an electrode of the P+ type layer on the back side, being connected to the P+ type layer on the back side through an opening of the SiO2 film 10122. 10115 indicates the distance of the portion of the electrode which overhangs the P+ type layer 10115, and which is 150 $\mu$m. 10103 indicates the channel N+ type layer on the back side, which is formed with 6E15/cm² and 40 keV of phosphorous, with a distance 10105 from the back-side P+ type layer of 350 $\mu$m (the distance must be longer over 10% than the thickness of the depletion layer.).

Figure 2:
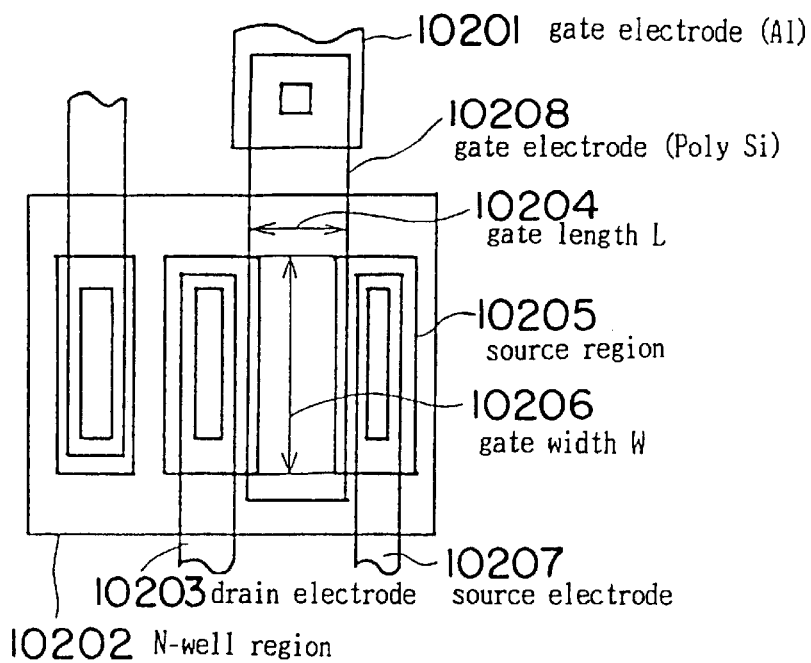
FIG. 2 is a plan view showing a PMOS transistor of the first embodiment of the present invention.

FIG. 2 is a plane view of one example of a single PMOS transistor of the semiconductor detector of the first embodiment of the present invention.

Figure 3:
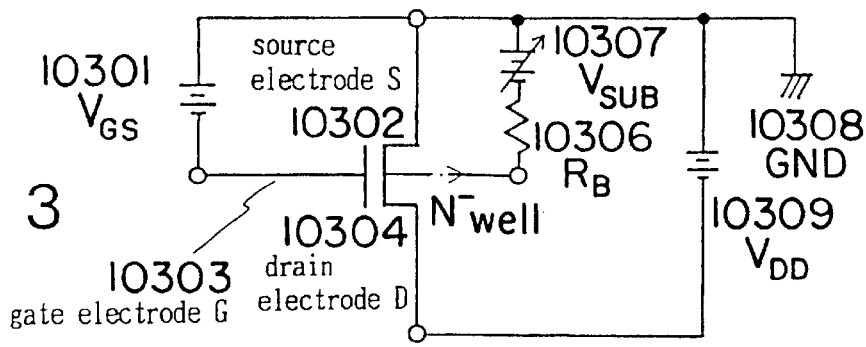
FIG. 3 is a circuit diagram showing the operation principle of the PMOS transistor according to the present invention.

10208 indicates a gate electrode (Poly Si), 10205 indicates the source region, and 10210 indicates the drain region. The gate electrode 10208 overlaps the source region 10205 and the drain region 10210. 10204 indicates the gate length L, which can be defined as shown in the Figure if diffusion in the traverse direction Yj is ignored for the present. 10206 indicates the gate width W, which can be defined by the dimensions of the source and the drain as shown in the Figure. 10209 indicates a gate electrode (Al), 10201 indicates the n-well electrode, 10202 indicates the n-well region, 10203 indicates the drain electrode, and 10207 indicates the source electrode, FIG. 3 is a schematic circuit diagram for explaining the operation principle of the above described PMOS transistor of the present invention. 10301 indicates VGS for applying voltage to the gate electrode, 10303 indicates the gate electrode G, 10302 is the source electrode S, and 10304 indicates the drain electrode D. 10305 indicates the n-well substrate, which is connected to bias voltage of the n-well substrate Vsub 10307 via the substrate bias resistance component RB 10306. 10308 indicates the ground (GND) and 10309 indicates the drain voltage VDD.

Figure 4:
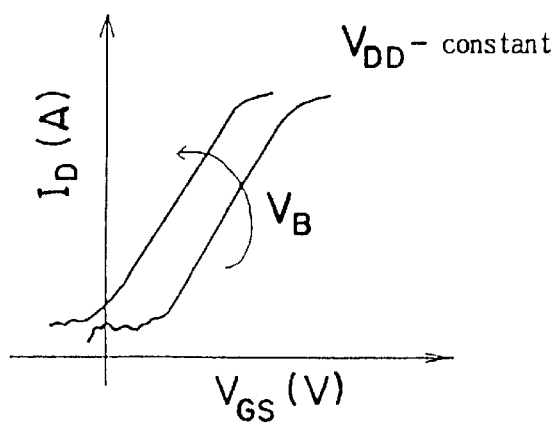
FIG. 4 is an explanatory diagram illustrating the operation of the PMOS transistor according to the present invention.

FIG. 4 is a graph illustrating the operation principle of the PMOS transistor of the present invention. The present invention utilizes the back bias effect of a MOS transistor in a novel structure. In general the threshold voltage Vth is raised by positively biasing the substrate (PMOS) with regard to the source, and the drain current ID is reduced with the same VGS in the non-saturation operation. As is apparent from FIG. 3 and FIG. 4, the present invention utilizes the phenomenon in which ID is increased under the same VGS condition by negatively biasing the substrate. Usually if the (PMOS) substrate is negatively biased with regard to the source, current flows between them because of the forward direction of the pn junction. By using the resistance component RB parasitically formed in the n-well and the N– substrate, an effect of the back bias at the negative bias is obtained in the present invention. Therefore the n-well electrode is located with a distance from the source region with the drain region between them, as is apparent from FIG. 1 and FIG. 2.

Next the detector in which a plurality of light detection element units are arranged two-dimensionally will be described. In general, the detection element units are referred to as pixels. For the semiconductor detector of the present invention having a surface resolution structured by arranging a plurality of PMOS detection elements as detection element unit, the detection element units will be referred to as pixels and their operation will be hereinafter described in detail.

Figure 5:
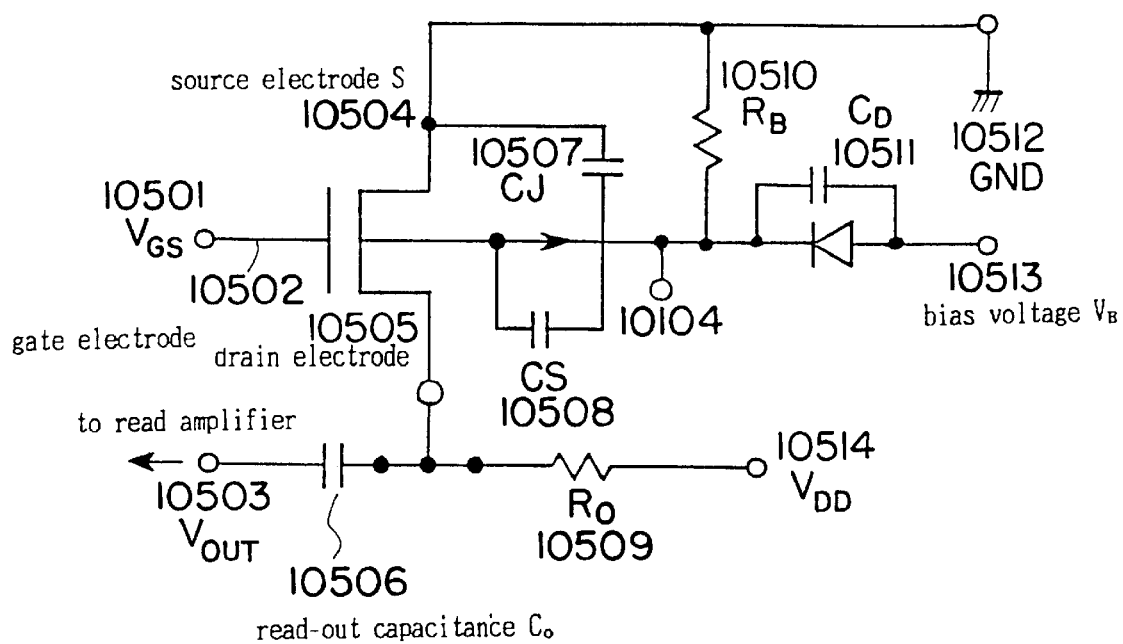
FIG. 5 is a circuit diagram showing the capacitance and the resistance components of the PMOS transistor of the present invention.

FIG. 5 is an equivalent circuit diagram showing the details of the capacitance and the resistance components of the POS transistor of the first embodiment of the present invention. 10501 indicates the gate bias voltage VGS, 10502 indicates the gate electrode G, 10504 indicates the source electrode S, 10505 indicates the drain electrode D. 10506 indicates the read-out capacitance CO, 10503 indicates the terminal of the output signal VOUT, 10508 indicates the capacitance CJ between the n-well and the source, 10507 indicates the capacitance CS between the n-well, and the channel region, and 10511 indicates the capacitance CD against the n-well and the P+ type layer on the back side of the substrate. 10510 is a bias resistance component of the n-well substrate, 10509 indicates a resistance component RO between the drain and VDD 10514, 10512 indicates the ground(GND), and 10513 indicates a bias voltage VB.

FIG. 6 is a table showing parameters of the physical quantity calculated for the description of the PMOS transistor of the present invention. The drain current Id in the MOS transistor when it is in the saturation region is given by the following equation:

$$Id = \frac{1}{2}\frac{W}{L}\mu s\, Cox(V_{gs} - V_{th})^2 \quad (1)$$

where W is the gate width, L is the gate length, $\mu$s is a carrier mobility of the effective surface, Cox is the gate capacitance per unit area, VGS is the source-to-gate voltage, Vth is the threshold voltage. Cox is given by the formula below. $\mu$s=120 cm²/Vsec.

$$C_{ox} = \varepsilon_o \varepsilon_{ox} \frac{1}{t_{ox}} \quad (2)$$

where $\epsilon$o is the permittivity in vacuum, $\epsilon$ox is the dielectric constant of SiO2, tox is the film thickness of SiO2. Assuming $\epsilon$o=8.854×10⁻¹⁴F/cm, $\epsilon$ox=3.9, CG is given by the following formula:

$$CG=WLCox \quad (3)$$

The bias voltage in the substrate (n-well) Vsub modulates Id and Vth as:

$$V_{th} = 2\phi F_n - \frac{qN_D L_D}{C_{ox}}\sqrt{\frac{2q|2\phi F_n - V_{sub}|}{kT}} \quad (4)$$

where q is the electric charge, k is the Boltzmann constant, T is the absolute temperature in Kelvin, ND is the doping concentration of the substrate (n-well), LD is the Debye length defined as:

$$L_D = \sqrt{\frac{\varepsilon_o \varepsilon_{si} kT}{q^2 N_D}} \quad (5)$$

and the Fermi potential in the substrate (n-well):

$$\phi F_n = -\frac{kt}{q} l_n \frac{N_D}{n_i} \quad (6)$$

where $\varepsilon_{31}$ is the dielectric constant of silicon (Si), ni is the intrinsic carrier concentration of Si. Flat band voltage is omitted from the formula 4 to simplify the description.

The "transconductance" gsub inside the substrate (n-well) can also be defined as Vsub dependency of the drain current by the following equation:

$$g_m = \frac{dId}{dV_{sub}} = -g_m \frac{dV_{th}}{dV_{sub}} \quad (7)$$

where gm is the so-called "transconductance" at the surface, which can be defined by the following equation:

$$g_m = \frac{dId}{dV_{GS}} = \sqrt{2Idk_p \frac{W}{L}} \quad (8)$$

Therefore it is apparent that the "transconductance" gsub inside the substrate (n-well) is proportional to gm.

And gsub/gm is $$\frac{g_{sub}}{g_m} = -\frac{dV_{th}}{dV_{sub}} = \frac{qN_D L_D}{2C_{ox}}\sqrt{\frac{2q}{kT|2\phi F_n - V_{sub}|}} \quad (9)$$

Thus it is apparent that the ratio gsub/gm indicates the sensitivity of the detector, and that the sensitivity is increased by making Cox ( 1/gate tox) smaller.

The leak current of the reverse-biased pn junction (p-i-n diode) is given by the equation IL=iL (Wwell)$^2$, and expressed by the formula:

$$i_L = \frac{1}{2}q\frac{n_i}{\tau_0}d \quad (10)$$

Assuming that ni=1.45×10$^{10}$cm$^{-3}$, τ 0=2.5×10$^{-3}$S, d=300 μm, then iL=10 nA/cm$^2$ and the leak current of 100×100 μm n-well is estimated to be IL=1 pA/pixel.

The capacitance CB with respect to the substrate (n-well) can be divided into three parts for the consideration purpose: capacitance from the n-well to the back side of the substrate (to the P+ type layer, junction side) (CD), capacitance from the n-well to the channel region (CS), and capacitance from the n-well to source region (CJ), which gives:

$$CB=CD+CS+CJ \quad (11)$$

First consider CD.

$$CD=AdCd \quad (12)$$

where Ad is the size of the, PMOS pixel. Cd is $$CD = \varepsilon_o \varepsilon_{si}\frac{A_d}{d} \quad (13)$$

where d is the thickness of the depletion layer.

Next consider the capacitance form the n-well to the source region. The thickness of the depletion layer of the pn junction of the n-well and the source region is $$d_{jo} = \sqrt{\frac{2\varepsilon_o \varepsilon_{si}}{q}\frac{N_A + N_D}{N_A N_D}V_{bi}} - L_d\sqrt{\frac{2qV_{bi}}{kT}} \quad (14)$$

where NA is the doping concentration of the source region, Vbi is the built-in potential defined as:

$$V_{bi} = \frac{kT}{q} l_n \frac{N_A N_D}{n_i^2} \quad (15)$$

Therefore the zero-biased junction capacitance Cjo is given by $$C_{jo} = \varepsilon_o \varepsilon_{si}\frac{1}{d_{jo}} \quad (16)$$

Therefore the capacitance from the source to the n-well is given by:

$$CJ = \varepsilon_o \varepsilon_{si}\frac{A_j}{d_{jo}} \quad (17)$$

Next consider the capacitance from the n-well to the channel region. The thickness of the depletion layer between the conductive channel on the front side and the n-well substrate is defined as:

$$d_{sub} = L_D\sqrt{\frac{2q|\phi_s - V_{sub}|}{kT}} \quad (18)$$

where φs is the surface potential of the PMOS conduction channel.

The capacitance is described as:

$$C_{sub} = \varepsilon_o \frac{\varepsilon_{si}}{d_{sub}} \quad (19)$$

where ND can be considered as ND of the PMOS transistor. φs is the surface potential of the channel. The capacitance between the channel and the n-well substrate over the whole gate region is given by:

$$CS = \varepsilon_o \varepsilon_{si}\frac{WL}{d_{sub}} \quad (20)$$

This equation is true when Vsub=0 and φs=2 φFn.

FIG. 7 is a table showing parameters of the electrical characteristics (when tox=540 nm and ND=1×10$^{16}$ cm$_{-3}$) of the PMOS transistor pixels according to the present invention, which have been derived from the above description.

CB, that is the total capacitance has a relationship with the doping concentration of the n-well, and is determined by the trade-off with the electric charge amplification factor described below, depending on the desired quantify and on specific cases.

In FIG. 5, the equivalent electric charge amount when the ionizing radiation such as X ray and γ ray and charged particles fall on in the manner of pulse is represented by Qo.

Then the electric potential which appears on the n-well substrate is defined in terms of time t or in terms of angular velocity ω as:

$$V_{su_b} = \frac{Q_o}{C_B}\exp(-t/R_BC_B) - \frac{Q_o}{C_B}\frac{1}{j\omega + 1/(C_BR_B)} \quad (21)$$

where RB is the bias voltage for maintaining the potential of the n-well.

The component which appears as the change of the drain current is $$I_d = I_D(DC) + g_{su_b}V_{au_b} \quad (22)$$

where Id (DC) is the DC component of the drain current. This is differentiated with a time constant t0, and the output signal (signal that is output from VOUT) of the differentiation network composed of resistance and capacitance including RO and CO, is $$\frac{Q_o g_{su_b}}{C_B}\frac{j\omega}{(j\omega+1)/(C_BR_B))(j\omega+1/(t_o))} \quad (23)$$

when CD RB is long enough with regard to the time axis, the output signal can be abbreviated as below $$\frac{Q_o g_{su_b}}{C_B}\frac{1}{j\omega + 1/t_o} \quad (24)$$

In actuality, in this embodiment, the calculation has been done with t0=150 nsec and CB RB=100 μsec. approx. Finally the total output charge after Fourier transform was $$Q_{out} = \frac{Q_o g_{su_b} t_o}{C_B} \quad (25)$$

The charge amplification factor Qout/Qo is largely affected by the n-well doping concentration and the gate SiO2 thickness (tox); the amplification factor increases as the n-well doping concentration is raised, and the amplification factor also increases as the gate tox is made thicker. However, if the factor surpasses the n-well doping concentration, CB increases and the time constant becomes slower as described above. Therefore each parameter value selected for this embodiment is an example.

FIG. 8 is a table listing parameters of the circuit characteristics of the detection elements of charged particles of the PMOS transistor pixels obtained in such a way as have been described above.

By this embodiment, a semiconductor detector of charged particles having both high-speed response characteristic and the electric charge amplification factor is achieved.

Another feature of the present invention is that the detector has a circuit-type, device-type structure, and that the formulae described above, particularly formula 20 and formula 25 have been devised to be used for determining the parameters of detectors (their amplification factor and time constant) respectively designed for various applications.

The description so far has been the case that a p-channel MOS is used. Naturally, an n-channel MOS can also be used in the same way. In that case, some change of the constant (such as mobility) is required, but what is fundamental and essential is exactly the same.

For example, from the semiconductor manufacturing process point of view, the gate tox can be set in the range from 10 nm to 10 thousand and several nm, and the n-well doping concentration can be set in the practical range from $1\times10^{14}$ $cm^{-3}$ to $1\times10^{18}$ $cm^{-3}$. The substrate concentration can be set in the practical range from $1.45\times10^{11}$ $cm^{-3}$ to $1\times10^{15}$ $cm^{-3}$.

Figure 9:
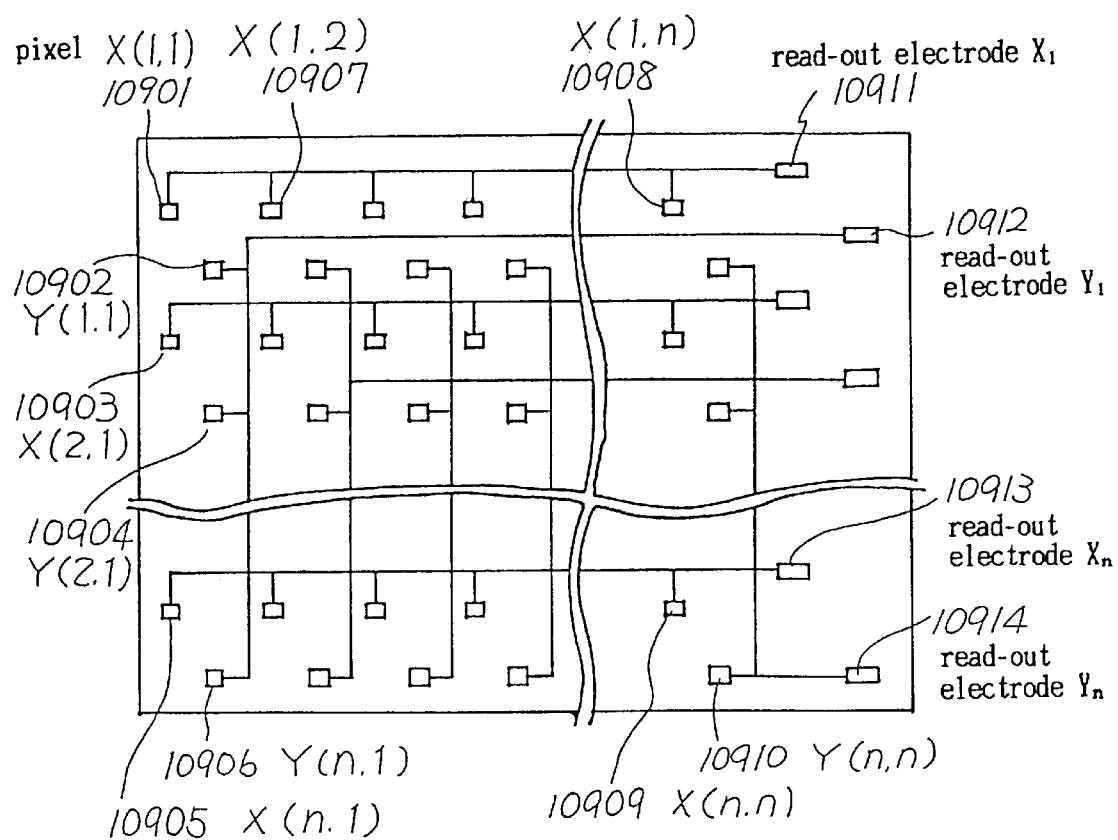
FIG. 9 is a plan view showing the first embodiment of the present invention arranged two-dimensionally.

FIG. 9 is a schematic plan view of the semiconductor device circuit layout on which a plurality of the PMOS pixels provided by the first embodiment of the present invention is arranged two-dimensionally. As is shown in the Figure, in a line of pixels for the X coordinate, pixel X(1,1) indicated by 10901, pixel X(1,2) indicated by 10907, . . . pixel X(1,n) indicated by 10908 are electrically connected in the number of n, and they are led out to the read-out electrode X1 indicated by 10911. In the same way, pixel X(2,1) indicated by 10903 to pixel X(2,n) indicated by 10905 are arranged for the lines in the number of n. The pixels in a line of the ordinal number n are lead out to the read-out electrode Xn indicated by 10913. In the line of pixels for the Y coordinate, pixel Y(1,1) indicated by 10902, pixel Y(2,1) indicated by 10904, . . . pixel Y(n,1) indicated by 10906 are electrically connected in the number of n, and they are led out to the read-out electrode Y1 indicated by 10912. The pixels in the line of the ordinal number n are led out to the read-out electrode Yn indicated by 10914.

10909 indicates pixel X(n,n), 10910 indicates pixel Y(n, n). Thus a semiconductor device having a surface resolution is obtained.

Figure 10:
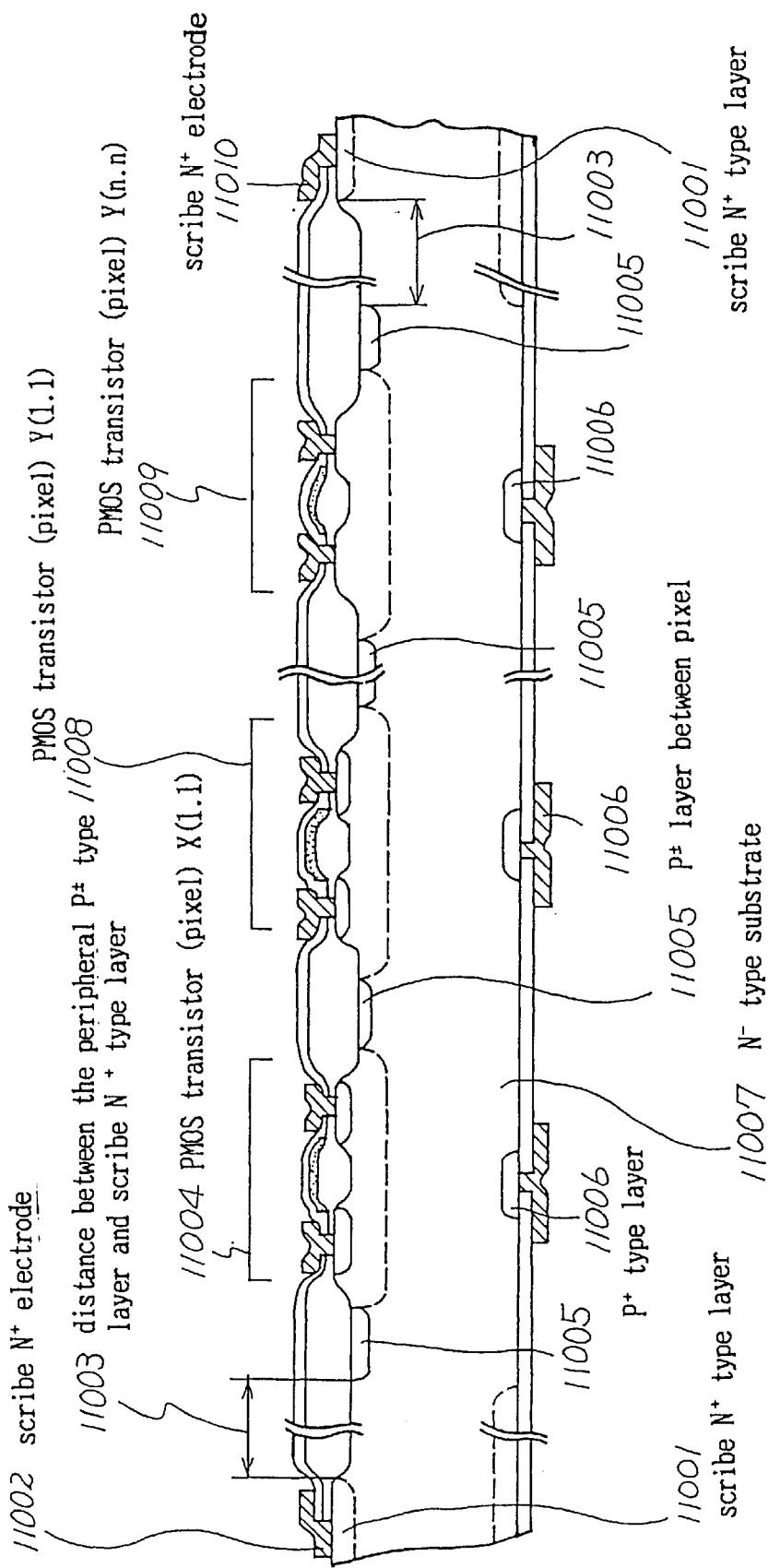
FIG. 10 is a section view showing the first embodiment of the present invention arranged two-dimensionally.

In the above description the number of X pixels and the number of Y pixels are the same, but it is of course that the number of X pixels and Y pixels need not be the same. This is because the number and the pitch of the pixels are determined by the shape to be detected, the desired resolution and so on. In FIG. 9 some connections such as power supply line for bias are omitted for simplification. FIG. 10 is a section view showing one example of FIG. 9. 11005 indicates the P± type layer arranged between pixels, which are formed with 30 keV, 7E13/cm² of boron to increase the separation of the signals between the adjacent pixels at the time of the detection of charged particles and so on. 11006 indicates the back-side P+ type layer of a small-size structure, and a plurality of this layer are arranged. The size is made small to lower the junction capacitance CD. The distance 11003 between the peripheral P± type layer and N+ type layer 11001 on the scribe-line (i.e., outer line, which is also called dicing line) needs to be 350 μm or more as described for FIG. 1. 11010 indicates the electrode of the scribe N+ type layer. This electrode is provided to equalize the potential of the peripheral N+ type layer surrounding it, and no other connection or potential is provided in the circuit because if provided the sensitivity (back bias effect) is affected. 11007 indicates the N− substrate, 10901 indicates the arranged PMOS transistor (pixel) X(1,1), 10902 indicates the arranged PMOS transistor (pixel) Y(1,1), 10910 indicate the arranged PMOS transistor (pixel) Y(n,n). In the Figure, the n-well electrode is omitted (it exists in reality). The depletion layer electrically formed is also omitted in FIG. 10.

Figure 11:
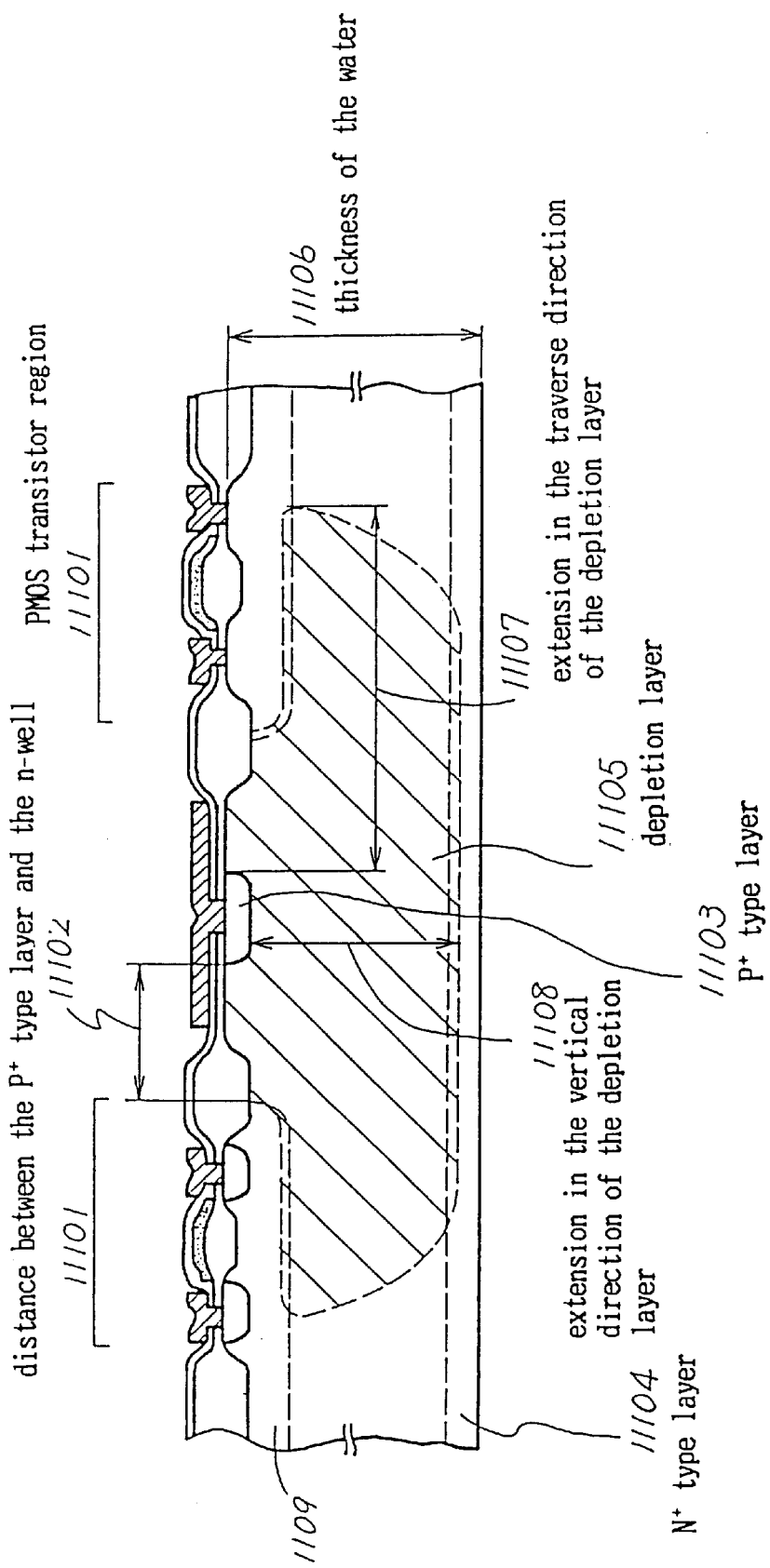
FIG. 11 is a section view showing a second embodiment of the present invention.

FIG. 11 is a section view showing the semiconductor detector of the second embodiment of the present invention. 11101 indicates the PMOS transistor region, 11103 indicates the P+ type layer, 11104 indicates the back-side N+ type layer, 11105 indicates the depletion layer, and 11109 indicates the n-well. 11102 indicates the distance between the P+ type layer and the n-well, 11106 indicates the thickness of the wafer, 11107 indicates the extension in the traverse direction of the depletion layer, and 11108 indicates the extension in the vertical direction of the depletion layer.

The feature of this embodiment is that the P+ type layer 11103 for forming the depletion layer 11105 is formed on the same side of the PMOS transistor region 11101, and that the PMOS transistor region 11101 is formed in such a way to surround the P+ type layer 11103.

At the lower part of the substrate, there is formed across the whole surface the N+ type layer 11104 which existed only at the surroundings in the first embodiment. The n-well electrode is omitted from the Figure.

Figure 12:
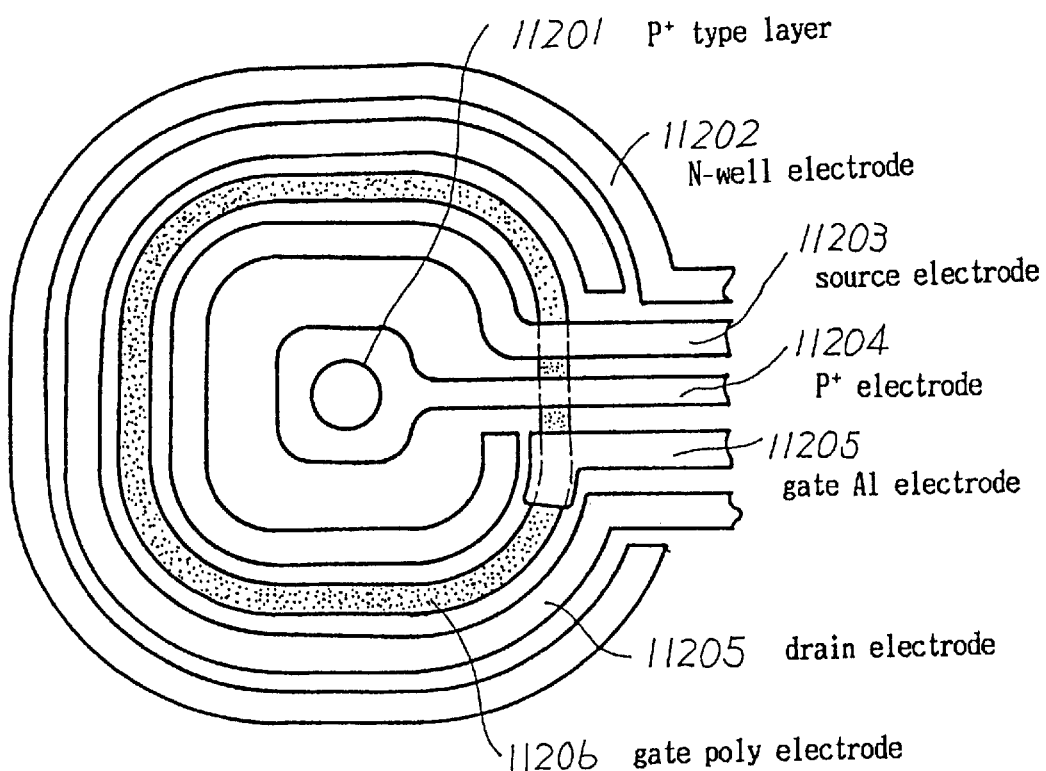
FIG. 12 is a plan view showing the second embodiment of the present invention.

FIG. 12 is a plan view showing one example of the semiconductor detector of the second embodiment of the present invention. 11201 indicates the P+ type layer, 11202 indicates the n-well electrode, 11203 indicates the source electrode, 11204 indicates the P+ type layer electrode, 11205 indicates the gate Al electrode, 11206 indicates the drain electrode, and 11207 indicates the gate Poly electrode. The gate Al electrode contacts the Poly electrode only at one part in this embodiment, but naturally may contact across it. According to this embodiment the processing of the back side of the semiconductor substrate is not so necessary, offering the advantage that the structure of the present invention can be obtained by the very common wafer process.

Naturally the detection having the same surface resolution as shown in the first embodiment can be provided by arranging a plurality of this semiconductor detector. Furthermore, to describe an example of specific values referring to FIG. 11, assuming that the thickness of the wafer 11106 is 300 $\mu$m for example, then in the case of specific resistance of 6 k·$\Omega$ cm, the depletion layer extends 300 $\mu$m at the bias voltage VB of approx. 60 V, and therefore the extension in the vertical direction 11108 stops at 300 $\mu$m, just where the N+ type layer 11104 exists at the bottom. At the same time the depletion layer extends in the traverse direction 11107 also of 300 $\mu$m. By further applying the bias voltage, the depletion layer radically extends in the traverse direction while the extension in the vertical direction remains stopped. In this way, even if the pitch of the element pixels (in this case combination of the PMOS and the P+ type layer) is 600 $\mu$m or more, the whole substrate can be depleted, thus a semiconductor detector is provided which is effective for detection of charged particles with surface resolution.

Figure 13:
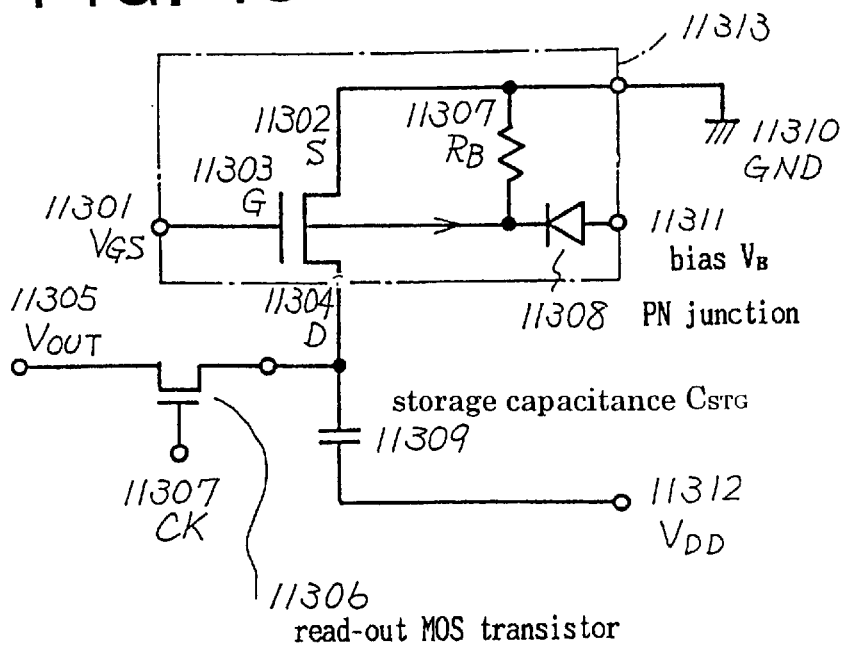
FIG. 13 is a circuit diagram illustrating an example of a read-out circuit of the present invention.

FIG. 13 is a block diagram showing an example of the read-out circuit which can be used in each embodiment of the present invention.

11313 indicates the semiconductor detector of the present invention, 11306 indicates the read-out MOS transistor, and 11309 indicates the storage capacitance CSTG. The feature of this read-out circuit is that It has a storage capacitance CSTG for output and has a read-out MOS transistor 11306 which is driven by time division (using reference signal called clock k or Ck 11304). In case a plurality of the semiconductor detector 11313 is arranged, signals from Vout 11305 are scanned and read out in a way of interlacing and synchronously with Ck. Generally image sensors, image pickup element and light detector called CCD of the read-out method of storage and selection type utilize this method. The high-speed response and amplification property of the present invention is very effectively obtained with this read-out method.

Figure 14:
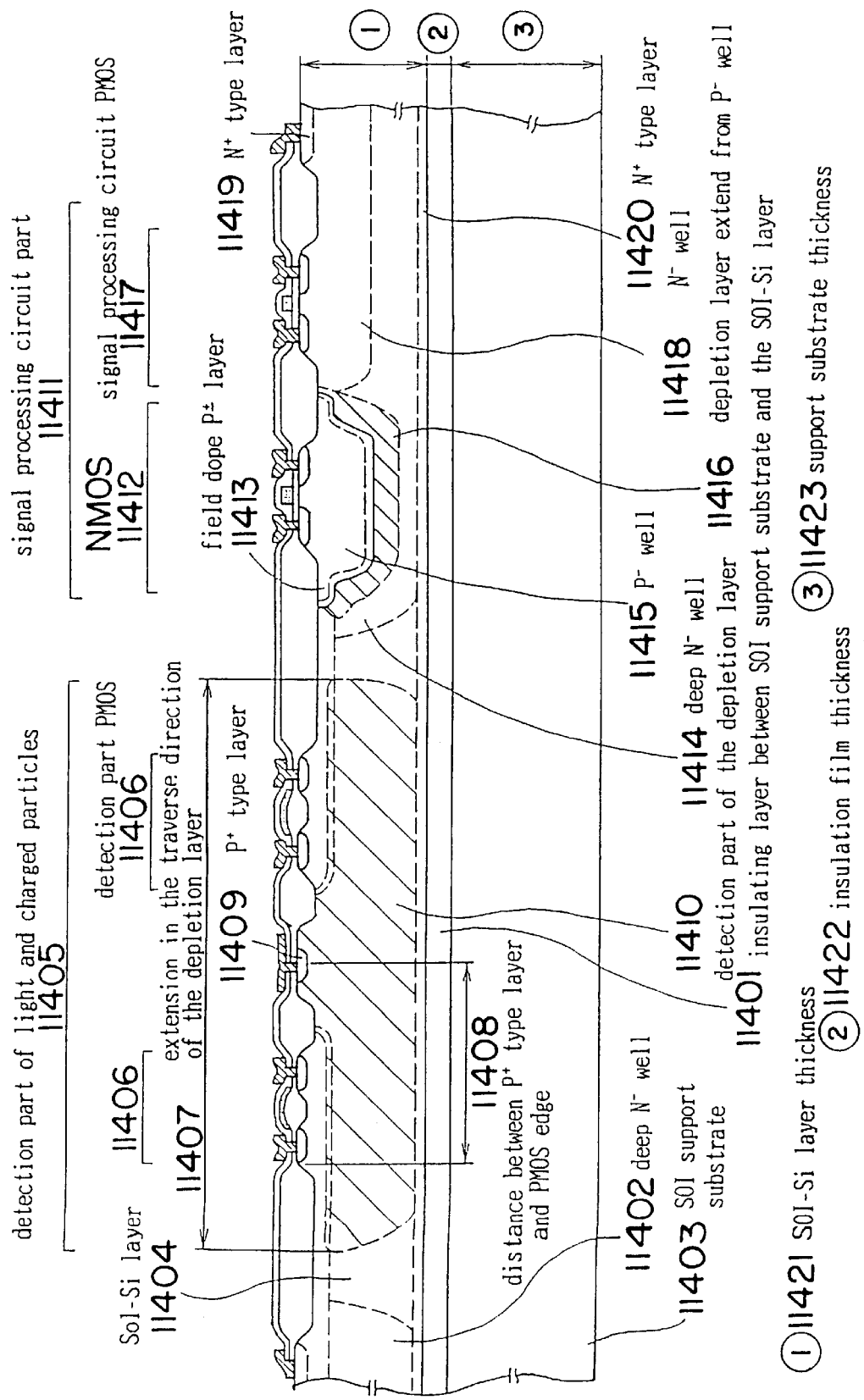
FIG. 14 is a section view showing a third embodiment of the present invention.

FIG. 14 is a section view showing the semiconductor detector of the third embodiment of the present invention. 11403 indicates an SOI support substrate, 11404 indicates an SOI-Si layer, 11401 indicates an insulating layer between the SOI support substrate and the SOI-Si layer, 11405 indicates the detection part of light and charged particles, and 11411 indicates a signal processing circuit part.

The support substrate 11403 consists mainly of Si or quartz. The substrate of quartz is convenient for the use with incident light on the back side. The thickness 11423 is 500 $\mu$m, and the insulating film layer 11401 is SiO2 having a thickness 11422 of is 1 $\mu$m. Over the layer there is formed an Si layer, constituting what is known in the art as a SOI substrate.

The SOI-Si layer 11404 is formed to have a specific resistance of 1 k·$\Omega$cm and a thickness 11421 of 18 $\mu$m. In this embodiment, the detection part 11405 is formed on the SOI-Si layer 11404 and the CMOS part 11411 constituting a signal processing circuit is formed on the same surface thereof. The detection part 11405 consists of a P+ type layer 11409 and a PMOS 11406, while the CMOS part 11411 consists of an NMOS 11412 and a PMOS 11417. 11419 indicates the scribe N+ type layer, and 11420 indicates the N+ type layer at the bottom of the SOI-Si layer. Without this layer, leak current may be caused due to the generated carriers when the depletion layer 11410 reaches the bottom.

11415 indicates a p-well, having a structure of the usual CMOS p-well for NMOS with a surface concentration of 2E16/cm$^3$ and a depth of 6 $\mu$m. In the same way, the n-well for PMOS indicated by 11418 has a structure of the usual CMOS n-well for PMOS with a surface concentration of 1E16/cm$^3$ and a depth of 6 $\mu$m 11413 indicates the usual field dope layer for element separation having a surface concentration of 1E18/cm$^3$ and a depth of 1 $\mu$m.

FIG. 15 is a graph showing the relationship between the dose amount of boron, $BF_2$ or $BF_3$ of the ion implantation for forming the P+ type layer for the bias of the detection part of the present invention and the final specific resistance of the substrate.

Assuming that the specific resistance of the semiconductor substrate is 10 k$\Omega$cm before the start of the manufacturing process, the final specific resistance changes due to various factors in the process, but the dose amount for forming the P+ type layer affects the specific resistance most as is shown in the graph of FIG. 15. This is valid only for the case in which the surface bearing 100 is used and the process includes non-oxidation thermal treatment over 1000° C. for over one hour. Such control of the final specific resistance is important for all the embodiments of the present invention, and is effective to obtain the desired thickness (in traverse and in vertical direction) of the depletion layer.

FIG. 16 is a graph showing the bias voltage VB and the thickness (width) of the extended (widened) depletion layer for each specific resistance of the substrate according to the third embodiment of the present invention. As is apparent from line C, when the specific resistance $\rho$=1 k$\Omega$cm, the depletion layer reaches 18 $\mu$m with VB of 3 V. Then the extension in the direction of the substrate thickness 11421 stops as shown by line d, while the extension of the depletion layer in the traverse direction 11407 raises steeply as shown by line e. By applying 5 V, it reaches 200 $\mu$m, therefore the depletion layer totally covers the area from the P+ type layer of the detection part to the end of the PMOS (the n-well electrode of the PMOS is omitted from the Figure but is actually located at the outermost periphery of the detection part, and the end thereof is the actual end) of the detection part if the area is within the dimension of 100 μm, allowing a full detection. In this manner by using this extension in the traverse direction of the depletion layer (by selecting the specific resistance and the thickness of the SOI-Si layer depending on each case), the desired detection is allowed with VB as low as 1.5 V, 3 V or 5 V, providing a very effective semiconductor detector for the detection part of remote control, image sensors and image pickup elements.

The depletion layer 11416 which extends with VDD of 5 V for example from the p-well 11416 at which NMOS is formed in the CMOS part of the signal processing circuit extends over 18 μm in the substrate of ρ=1 kΩcm, therefore it is practical to provide a deep n-well 11414. Provided the surface concentration is $5E14/cm^3$, then the depth may be less than 18 μm (although the depth is 18 μm as shown in the Figure in this embodiment) if it allows to contain p-well so that the leak current is held sufficiently low.

Naturally, this embodiment is further effective if the P+ type layer for bias is located on the front side in such a manner as to enclose the concentric circle in the same manner as the light-reception part PMOS as is described earlier, and it is also effective to use the P− substrate.

FIG. 17 is a section view showing the manufacturing method of the semiconductor detector of the first embodiment of the present invention.

In FIG. 17 (*a*), 11701 indicates SiO2, 11706 indicates the N− type semiconductor substrate (the first semiconductor substrate), which has a thickness of 600 82 m as is indicated by 11702, a specific resistance of 6 kΩ cm, and surface bearing 100. 11705 indicates the part of the phosphorus ion implantation, into which phosphorus has been selectively ion implanted using a photoresist and so on at 40 keV and $5E15/cm^2$ as described in the first embodiment. 11703 indicates the part of the $BF_2$ ion implantation, into which $BF_2$ has been selectively ion implanted using a photoresist 11704 and so on at 60 keV and $1E14/cm^2$ as in the case of the phosphorus ion-implantation. The thickness of SiO2 11701 is 500 Å. Next, after the process of oxidation and diffusion, SiO2 of 4000 Å thickness 11707, a P+ type layer 11709 and an N+ type layer 11708 are obtained (FIG. 17 (*b*)). Thereafter the surface of the first semiconductor substrate 11706 where the above mentioned P+ type layer 11709 exists is brought into contact with the second substrate (Si in this case) 11712. The thickness of the second substrate 11711 is 300 μm. While thus contacted, the substrates are heat treated for two hours in 750° C. N2 to solidify the bonding of the substrates and thereby to obtain a junction substrate illustrated in FIG. 17 (*c*). Further, the first semiconductor substrate is subjected to grinding and mirror finished to have a thickness of 300 μm. As a result a junction substrate of the total thickness of 600 μm is produced which is shown in FIG. 7 (*d*). This junction substrate is subjected to a series of process steps of the formation of the PMOS transistor 11715 of the present invention to obtain the junction substrate shown in FIG. 17 (*e*). Then the second substrate 11712 is removed, and after the process whereby an opening 11717 is formed at the predetermined part of SiO2 on the back side and the process whereby a P+ type layer electrode 11716 is formed, what is illustrated in FIG. 17 (*f*) is obtained. As this embodiment is accomplished by means of the above process steps, a substrate of 600 μm thickness can be temporally handled during the production process of the semiconductor detector having a desired thickness of the depletion layer (thickness of the substrate) of 300 μm, thus the process for large-diameter wafer of 6 inches and 8-inches can be employed, allowing to utilize the advantages of more advanced process technologies (such as fine processing).

This manufacturing method has been described mainly in connection with the first embodiment, but the method can be applied to the manufacturing method of the other embodiments by making slight modifications to the method.

Figure 18:
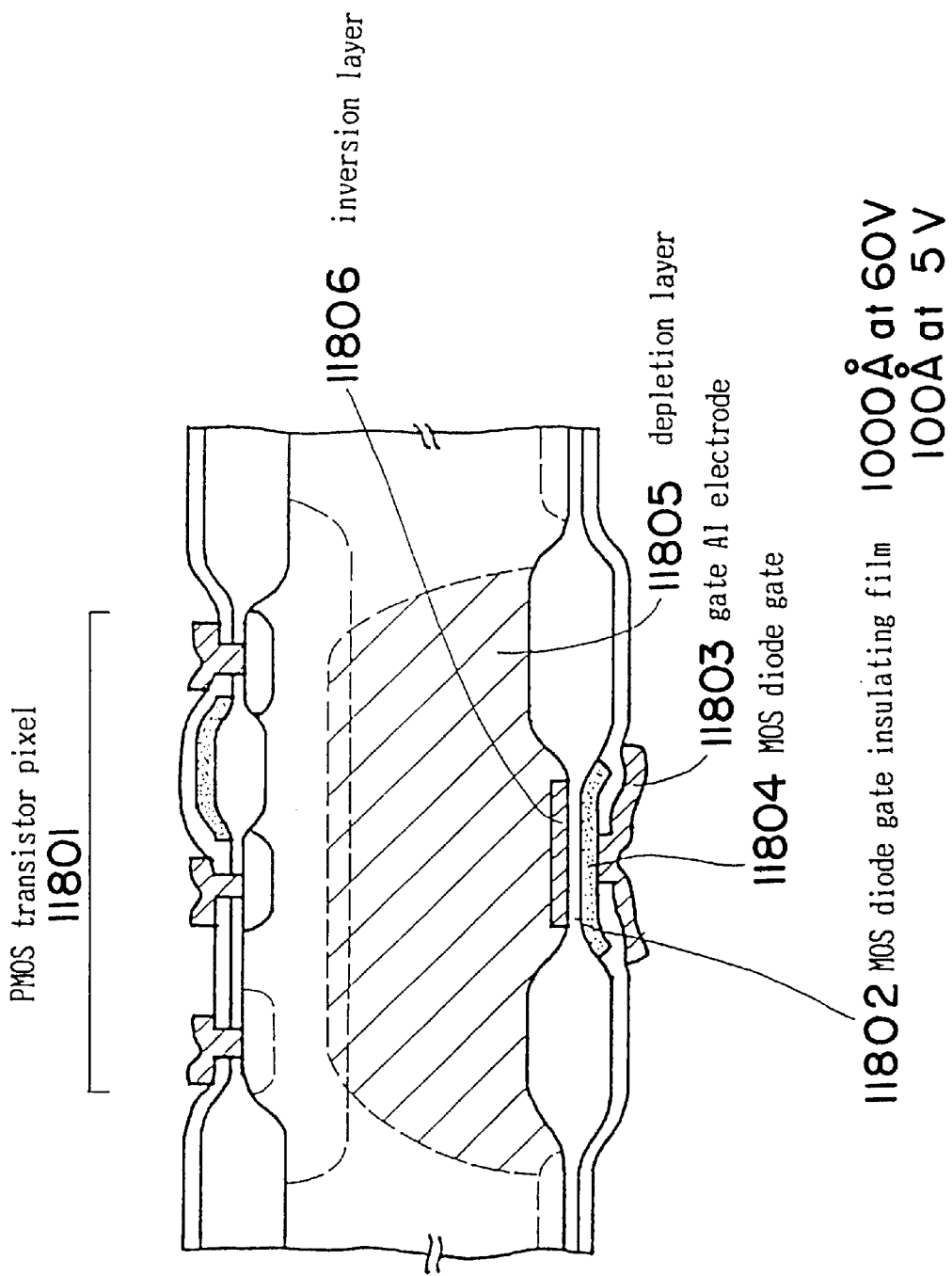
FIG. 18 is a section view showing a semiconductor device of a fourth embodiment of the present invention.

FIG. 18 is a section view schematically showing the semiconductor device of the fourth embodiment of the present invention. 11801 indicates a PMOS transistor detection element, 11802 indicates a gate insulating film, 11803 indicates an Al gate electrode, 11804 indicates a Poly Si gate electrode, 11805 indicates a depletion layer, and 11806 indicates an inversion layer.

In the substrate on which the PMOS transistor 11801 is formed, on back side thereof, a MOS diode structure is formed which acts to form the depletion layer 11805 with back bias VB being applied. The MOS diode structure consists of the gate insulating film 11802, the Poly Si gate electrode 11804, and the Al gate electrode 11803. By applying a negative bias voltage VB, if the substrate is N− type, to this MOS diode structure, the inversion layer 11806 is formed, and then the depletion layer 11805 is formed.

Here, for the bias VB, a pulse voltage of 300 kHz or more is applied to sufficiently extend the depletion layer. If the detection of light rather than the detection of charged particles is intended and the readout is the storage type, it is also convenient to synchronize this pulse with Ck. While the gate insulating film is preferably as thin as possible since avalanche breakdown becomes higher as the concentration of the inversion layer is higher, the film needs a minimum thickness to have an electric field strength of 3 MV/cm or less against the applied VB to avoid dielectric breakdown or problem of durability. Yet an electric field strength may be 5 MV/cm or less in this case since VB is applied to that side of the depletion layer which is extended. Thus while VB varies depending on the desired thickness of the depletion layer, the gate insulating film may be 1000 Å or more when VB=50 V, and 100 Å or more when VB=5 V.

Figure 19:
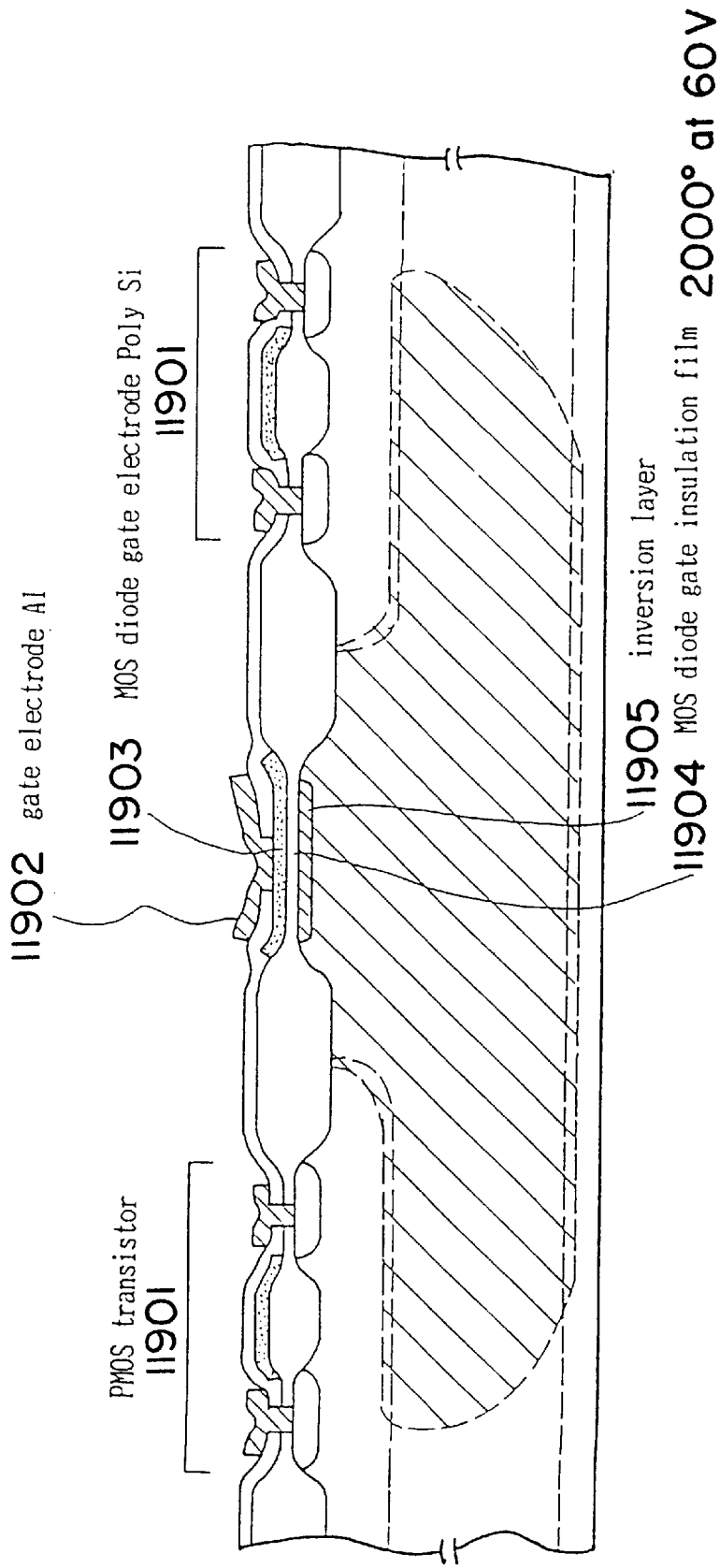
FIG. 19 is a section view showing a semiconductor device of a fifth embodiment of the present invention.
Figure 21:
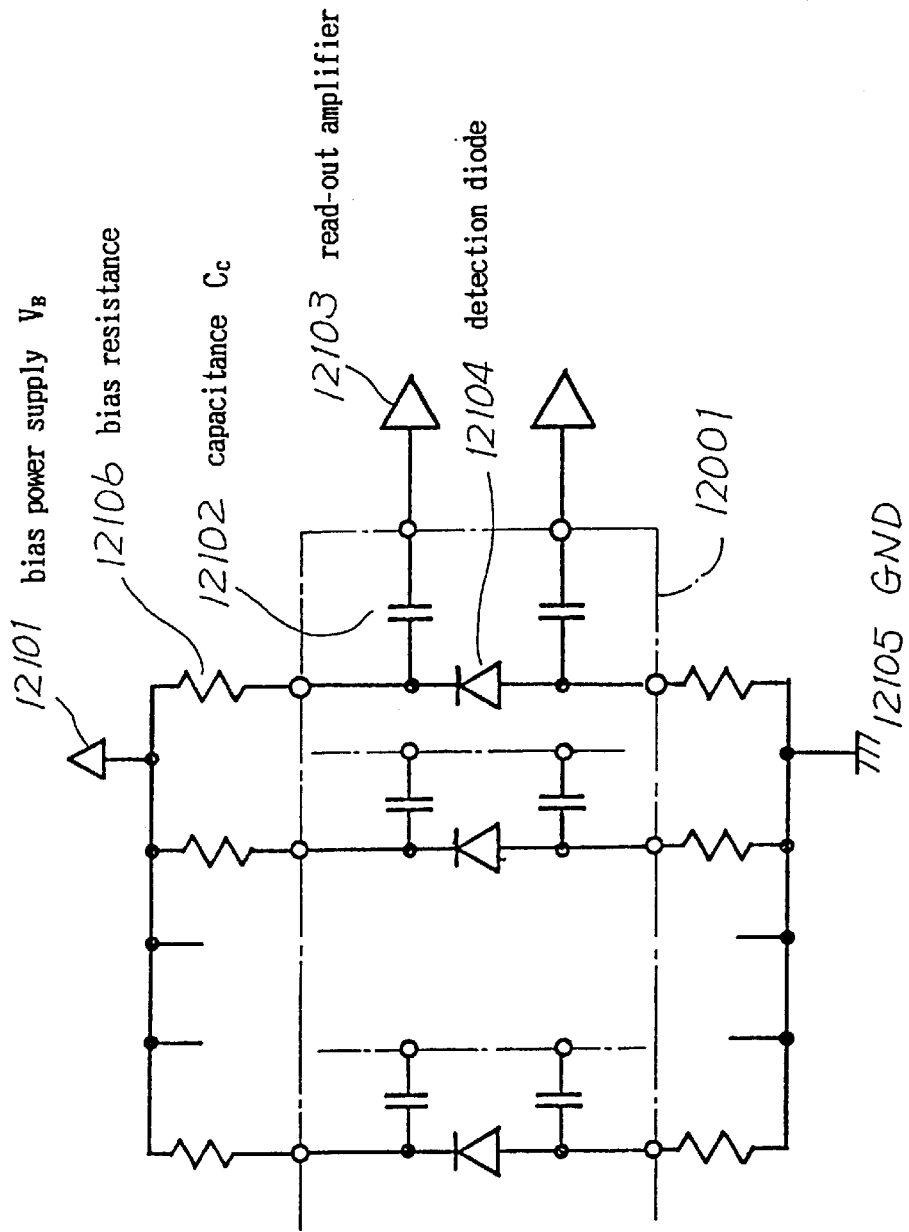
FIG. 21 is a circuit diagram illustrating the operation of the conventional semiconductor device for the detection of charged particles.

FIG. 19 is a section view showing the semiconductor device of the fifth embodiment of the present invention. The difference from the fourth embodiment is that in this embodiment back bias is applied by a MOS diode, and the MOS diode is located on the side of the detection PMOS. 11901 indicates the detection PMOS transistor, 11902 indicates the AL gate electrode, 11903 indicates the Poly Si gate electrode of the MOS diode, 11904 indicate the gate insulating film of the MOS diode, and 11905 indicates the inversion layer. The n-well electrode is omitted from the Figure.

Embodiments 1 to 5 have been described above as basic forms to explain that the present invention may have a variety of structures. Examples of further modification of the above embodiments will now be described.

Figure 22:
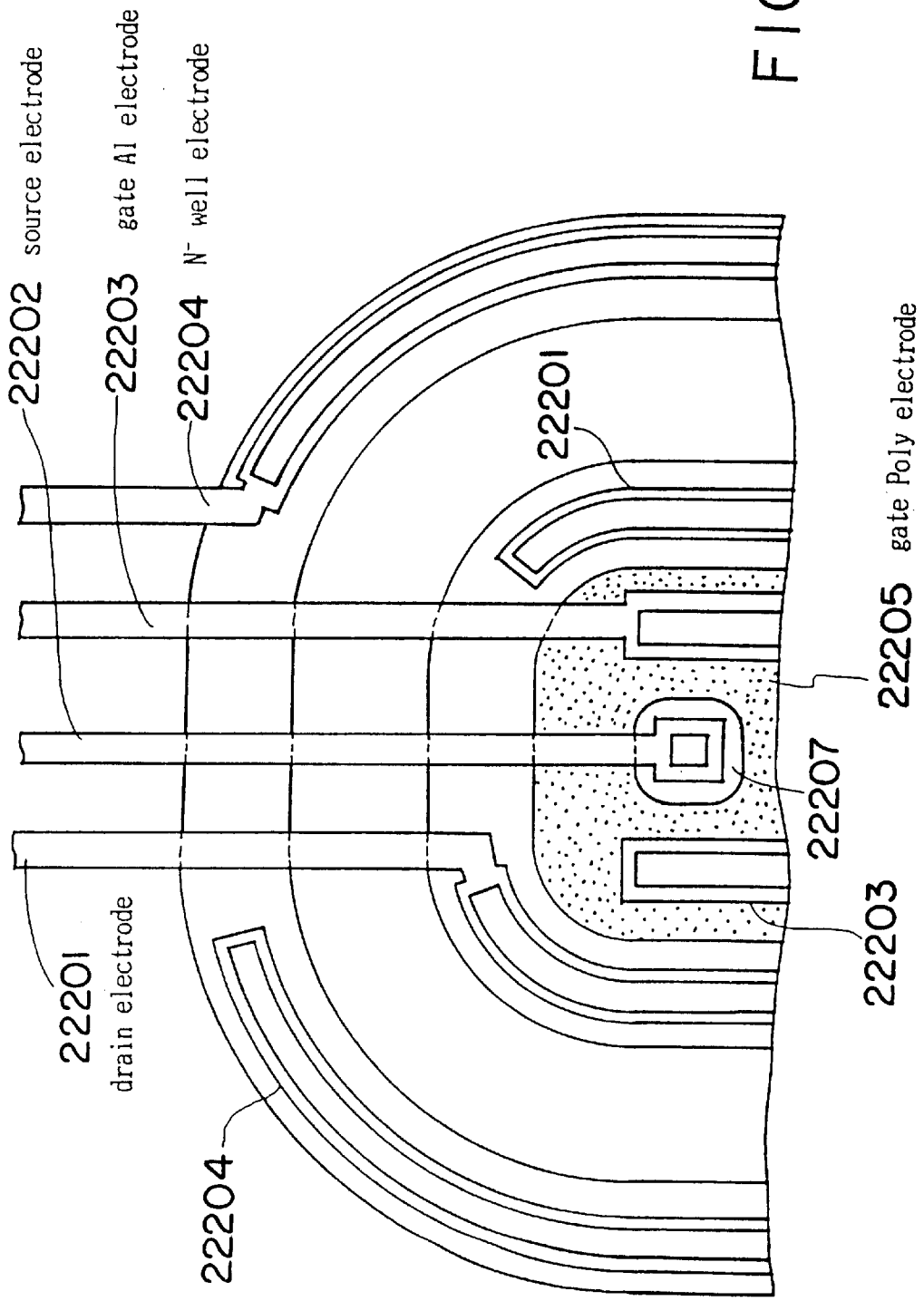
FIG. 22 is a plan view of a first modification of the first embodiment of the present invention.
Figure 23:
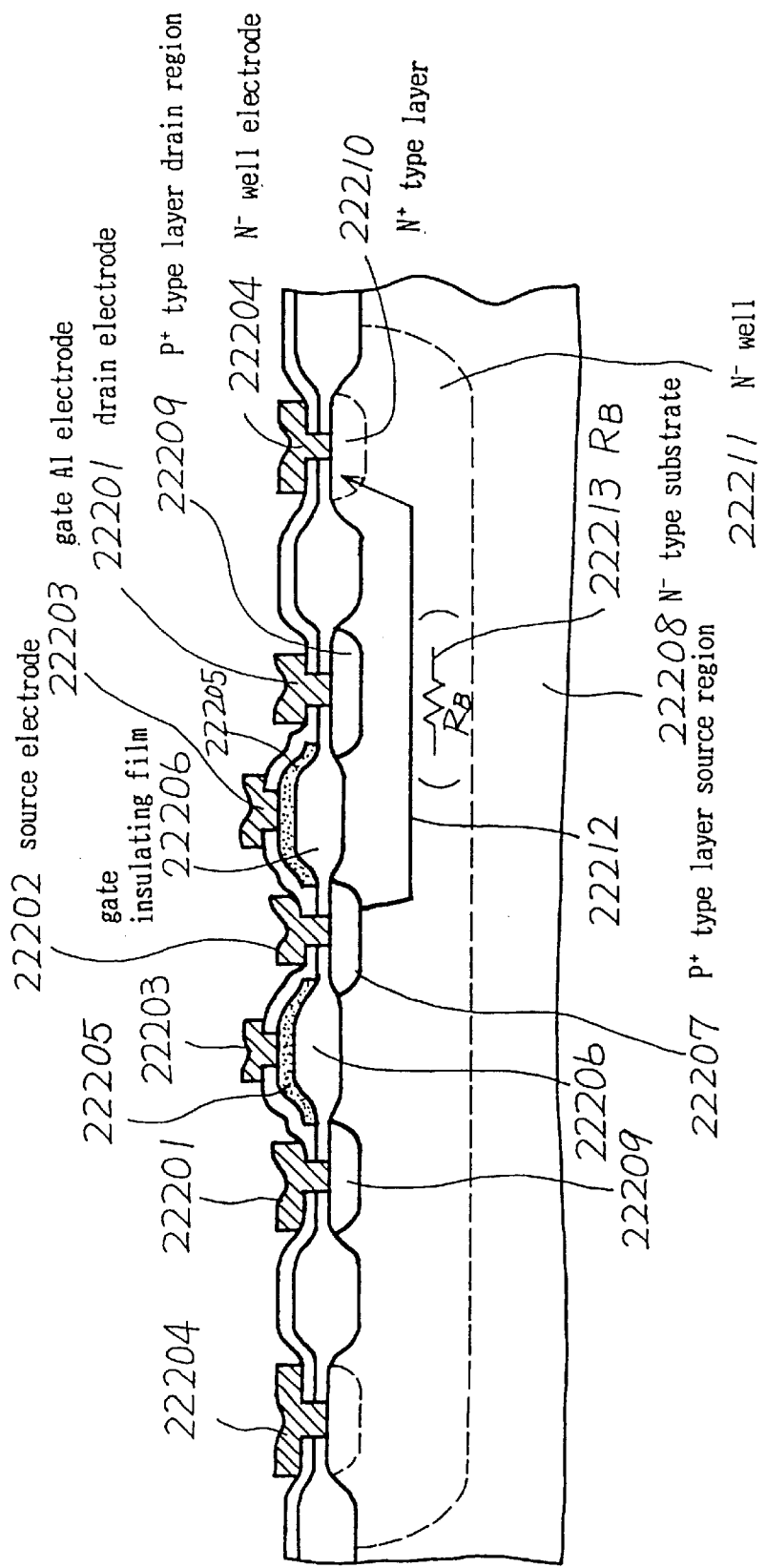
FIG. 23 is a section view of a first modification of the first embodiment of the present invention.

FIG. 22 is a plan view of the first modification of the first embodiment of the semiconductor detector of the present invention, and FIG. 23 is a section view thereof. 22201 indicates the drain electrode, 22202 indicates the source electrode, 22203 indicates the gate electrode (such as Al; aluminum), 22204 indicates the n-well electrode, 22205 indicates the gate Poly (Poly Si) electrode, 22206 indicates the gate insulating film, 22207 indicates the source region consisting of a P+ type layer, 22208 indicates the N− type substrate, 22209 indicates the drain region consisting of a P+ type layer, 22210 indicates the N+ type layer, 22211 indicates the n-well region, 22212 indicates the current path, and 22213 indicates the bias resistance RB.

The gate region consisting of the gate insulating film 22206 and the gate Poly (Poly Si) electrode 22205 encircles the source region 22207 in the shape of concentric circles. Around the periphery of this, the drain region 22209 and the N+ type layer 22210 also encircles the source region in the shape of concentric circles. The N+ type layer 22210 is for providing the n-well electrode 22204 from the n-well region 22211. The n-well electrode 22204 is located in such a manner that it is led outside the concentric circles to be connected to the signal processing circuit. The lower half of the concentric circles are omitted from FIG. 22. The back side of the substrate where the back-side P+ type layer is formed is omitted from FIG. 23.

In this structure, as the source region is totally encircled by the other regions with uniform distances, detection with uniformity over the surface of the incident charged particles is allowed. Furthermore, as there is no crossing part or angles, the fall in pressure resistance due to the unnecessary concentration of the electric field is prevented. Also, as the current path 22212 gate region passing under the gate region and the drain region has to be traversed from the source region to the N+ type layer which provides the n-well electrode, a bias resistance RD 22213 which is equivalently stable and has a high value is obtained (See FIG. 23). Either the n-well electrode 22204 and the gate Al electrode 22203 may be used as connected, or an external circuit may be added if the resistivity of RB is insufficient. In the latter case the example of FIG. 24 described in the following is convenient.

Figure 24:
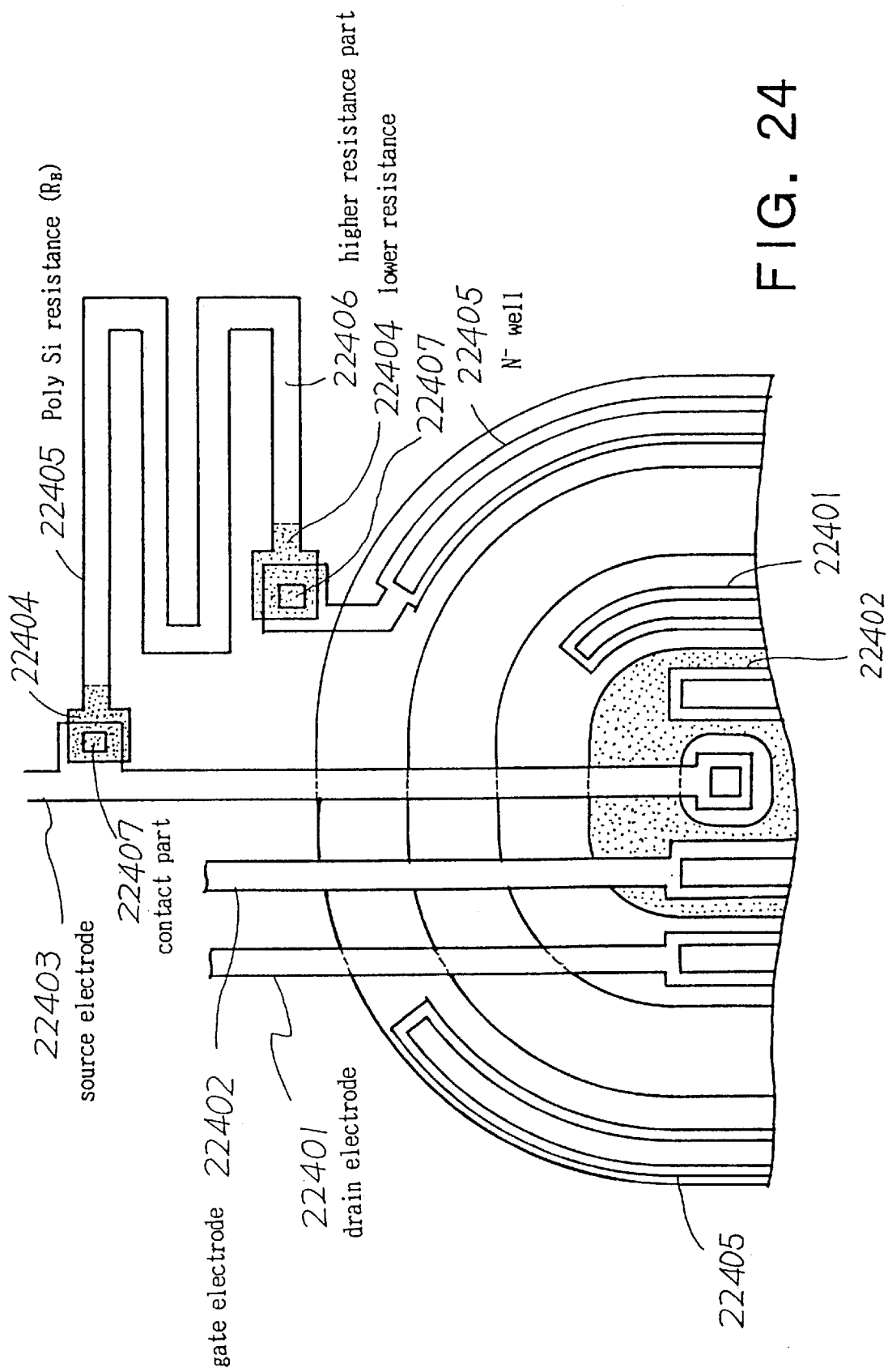
FIG. 24 is a plan view of a second modification of the first embodiment of the present invention.

FIG. 24 is a plan view of the second modification of the first embodiment of the semiconductor detector of the present invention.

22401 indicates the drain electrode, 22402 indicates the gate electrode, 22403 indicates the source electrode, which consists of Al and others. 22404 indicates the part of lower resistance, 22405 indicates the n-well electrode, 22406 indicates the part of higher resistance, and 22407 indicates the contact part.

The n-well electrode 22405 is connected to the Poly Si (Poly silicone) resistance (RB) 22406 provided on the same surface of the semiconductor substrate, and is electrically connected to the source electrode 22403. Poly Si resistance is a higher resistance part 22406 having a resistivity of several tens $M\Omega/\square$ (per unit area) where phosphorus and other materials are implemented with a dose amount of approx. $1 \times 10^{14}$ cm$^{-2}$. By forming the higher resistance part into a bent shape of several plies, resistivity may be several hundreds $M\Omega$ to several $G\Omega$. Either end thereof consists of a lower-resistant part 22404 having a part 22407 which contacts Al electrode. For simplicity, the lower half of the concentric circles is omitted from the Figure. This structure makes an external resistance unnecessary, hence a very useful structure is obtained for a device where a plurality of detection elements of the present invention is arranged.

Figure 25:
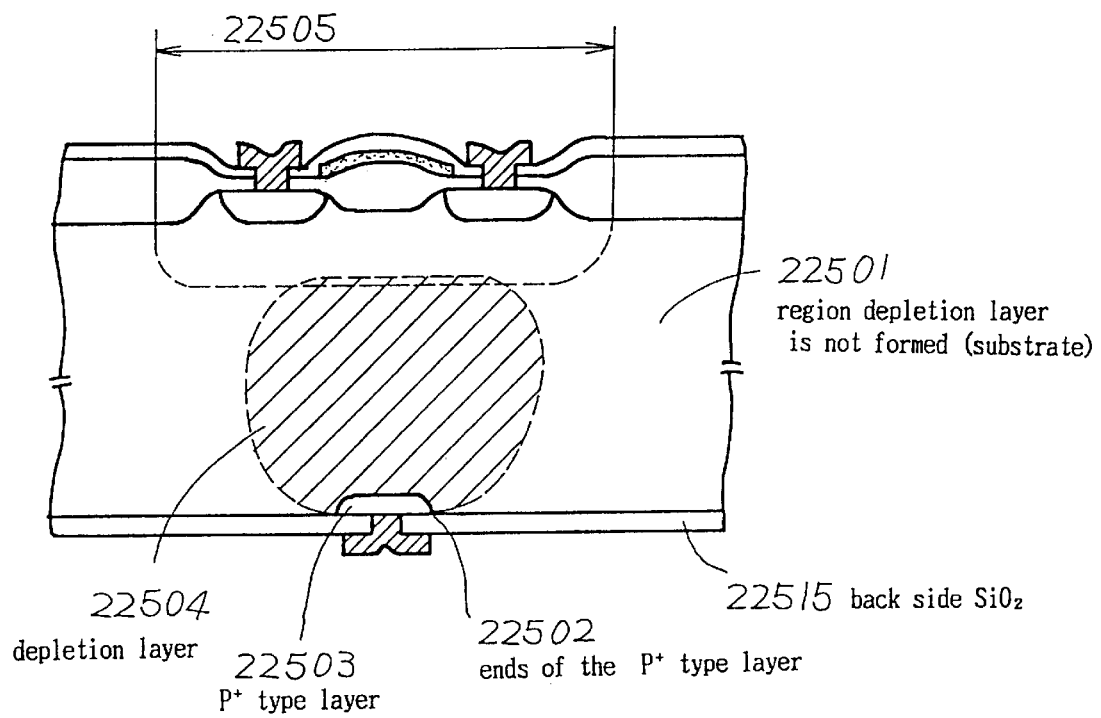
FIG. 25 is a section view of a third modification of the first embodiment of the present invention.
Figure 26:
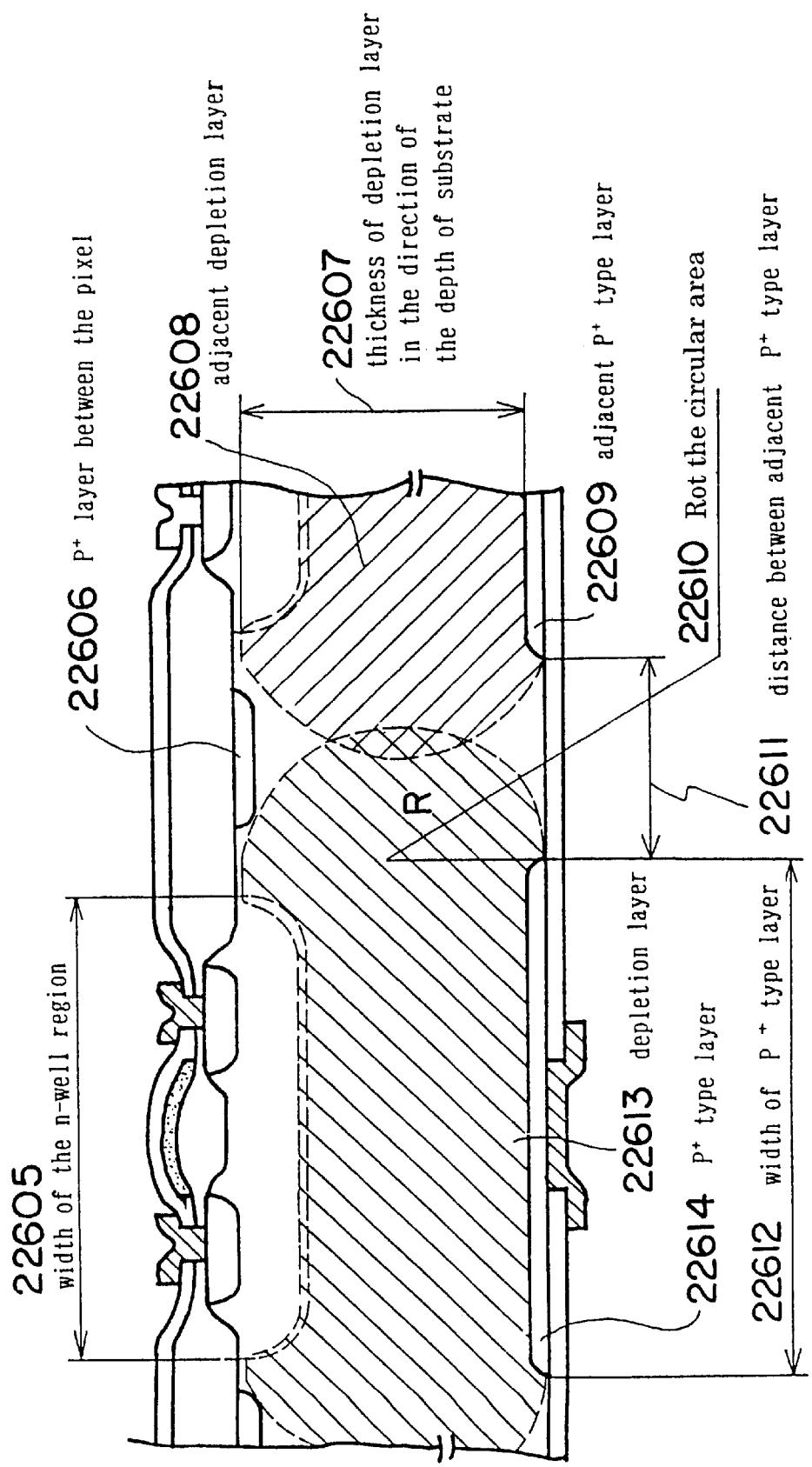
FIG. 26 is a section view of a fourth modification of the first embodiment of the present invention.

FIG. 25 is a section view for explaining the third modification of the first embodiment of the semiconductor detector of the present invention, and FIG. 26 is a section view of the fourth modification thereof with further modifications to FIG. 25.

In FIG. 25, 22501 indicates the substrate, and particularly indicates the region where the depletion layer is not formed. 22502 indicates the ends of the P+ type layer, 22503 indicates the back-side P+ type layer, 22504 indicates the depletion layer, 22505 indicates the width of the n-well region, and 22515 indicates the surface insulating film SiO2 formed on the back side.

In this example, the back-side P+ type layer 22503 for extending the depletion layer by applying a reverse bias to the pn junction is sufficiently smaller in comparison with the width of the n-well region 22505. If this small back-side P+ type layer is combined with such a condition of the surface between the substrate and the back-side surface insulating film (SiO2) 22515 where there is much Qss and N− type is accumulated, along with a substrate specific resistance and a substrate thickness (which is roughly the same as the thickness of the depletion layer to be extended in the direction of the depth of the substrate), the depletion layer 22504 extends in the shape of circular arc which comes in contact with the P+ end part (surface) 22502 as shown in the Figure, with the result of not only failing to cover the substrate of the n-well part but also leaving a large volume of region 22501 where the depletion layer is not formed. Such region becomes insensitive region, besides the incident charged particles scatter and diffuse as carrier, thereby adversely affecting signal-to-noise ratio and causing the signal delay.

This disadvantage is improved in FIG. 26, in which 22605 indicates the width of the n-well region, 22606 indicates the P± layer formed between the pixels, 22607 indicates the thickness of the depletion layer in the direction of the depth of the substrate, 22608 indicates the adjacent depletion layer, 22609 indicates the adjacent P+ type layer, 22610 indicates R of the circular arc, 22611 indicates the distance between the adjacent P+ type layers, 22612 indicates the width of the P+ type layer, 22613 indicates the depletion layer, and 22614 indicates the P+ type layer.

In this Figure, significant difference from FIG. 25 is the structure in which the dimension 22612 of the back-side P+ type layer 22614 is larger than the dimension 22605 of the n-well region.

Also, in the device where a plurality of detection elements is arranged, the distance 22611 between the adjacent back-side P+ type layer 22609 is made be shorter than the dimension 22607 of the depletion layer to be extended in the direction of the depth of the substrate. By doing so, the depletion layer in the shape of the semicircular arc (22610) in radius section comes in full contact with the adjacent depletion layer and overlaps it. 22606 indicates the P± type layer between pixels. For simplicity the n-well electrode and the back-side N+ type layer are omitted from the Figure. This structure has the advantage that it resolves the problem of the generation of a large volume of non-depleted region 22501 shown in FIG. 25.

Figure 27:
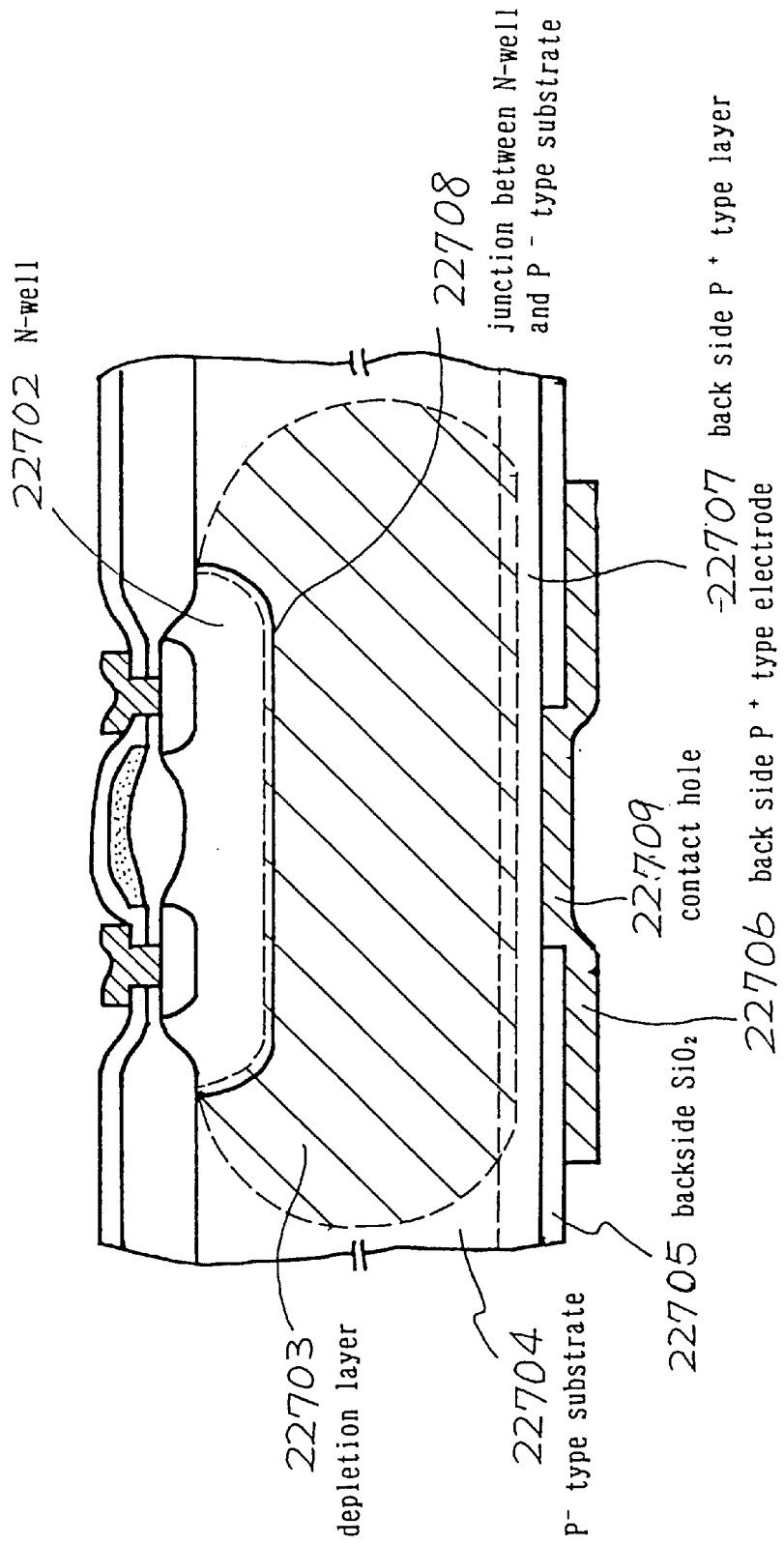
FIG. 27 is a section view of a fifth modification of the first embodiment of the present invention.

FIG. 27 is a section view of the fifth modification of the first embodiment of the semiconductor detector of the present invention. 22701 indicates the p-channel MOS transistor, 22702 indicates the n-well, 22703 indicates the depletion layer, 22707 indicates the P− type substrate, 22105 indicates the back-side SiO2, 22706 indicates the back-side P+ type layer electrode, 22707 indicates the back-side P+ type layer, 22708 indicates the junction of the n-well and the P− type substrate, and 22709 indicates the contact hole.

The p-channel MOS transistor 22701 which is the detection part of the present invention has an n-well and is formed on the P− type substrate 22704 as is apparent from the Figure. By forming the detection element on the P− (a specific resistance in the range of several $\Omega$cm to several k$\Omega$cm is possible in practice and is determined according to the application and the desired characteristics) substrate instead of the N− type substrate which has been described so far, the depletion layer extends from the junction 22708 between the n-well and the P− type substrate with the junction being the maximum field strength, as opposed to what is described so far (the depletion layer extended from the junction surface between the back-side P+ type layer and the N– type substrate with the junction being the maximum field strength.) The back-side P+ type layer 22707 has the back-side SiO2 22705, and the back-side P+ type layer electrode 22706 is formed over the back-side SiO2 22705. The back-side P+ type layer electrode 22706 is electrically connected via the contact hole 22709 provided on the back-side SiO2 22705 to the back-side P+ type layer 22707. Naturally a total surface electrode may be provided instead of SiO2 and contact hole.

Therefore rather than forming a junction on the back side as has been described above, this structure enables the use of the conventional (common) semiconductor manufacturing process without semiconductor processing on the both sides, hence a very advantageous structure is obtained with regard to the manufacturing cost and the yield ratio.

Figure 28:
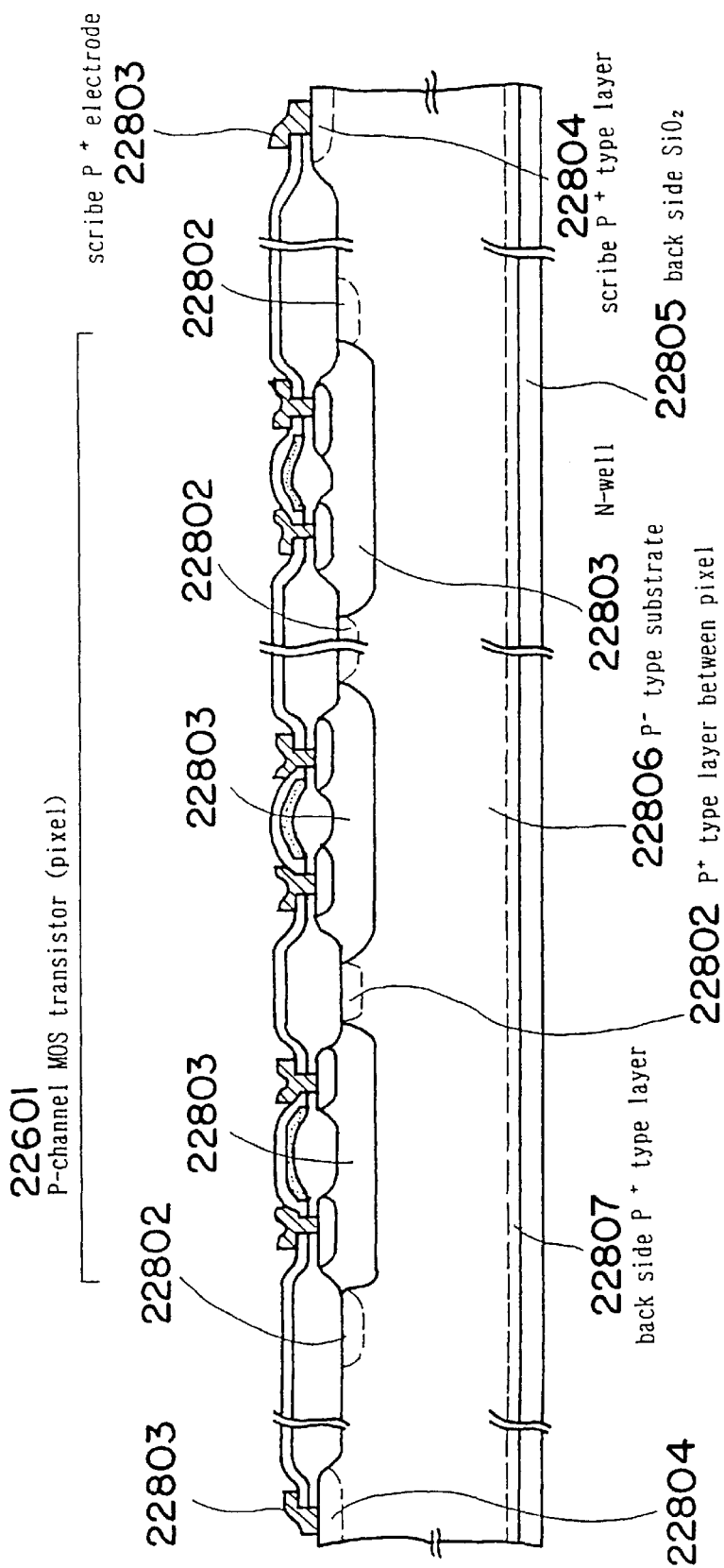
FIG. 28 is a section view showing an example wherein a plurality of the detection part (PMOS pixels) of the fourth modification of the first embodiment of the present invention is two-dimensionally arranged.

FIG. 28 is a section view showing an semiconductor device wherein a plurality of the semiconductor device of the fourth modification of the first embodiment of the present invention is two-dimensionally arranged as pixels.

22801 indicates a p-channel MOS transistor (pixel), 22802 indicates the P± type layer formed between the pixels, 22803 indicates the n-well, 22804 indicates the scribe P+ type layer, 22805 indicates the back-side SiO2, 22806 indicates the P– type substrate, and 22807 indicates the back-side P+ type layer.

The pixels 22801, which are arranged detection parts, have the P± type layers 22802 between them in the same manner as the pixels two-dimensionally arranged in the first embodiment, and are formed in the P– type substrate 22806. The back-side P+ type layer 22807 is formed across the surface without being patterned (or with patterning rendered, as may naturally be done), and the back-side SiO2 22805 for the protection covers the whole surface.

In this structure the bias is applied from the P+ type layer electrode 22803 via the front-side P+ type layer 22804. Naturally the bias may be applied from the back side by forming an electrode on the back side.

In addition to the advantage from the manufacturing point of view described for FIG. 27, the semiconductor detector of this structure has another advantage that the use of the P– type substrate resolves the problem of "p-type inversion". "p-type inversion" indicates a phenomenon by which, in a detector of charged particles using an N– type substrate of a high specific resistance (1 kΩcm or more) as described in the present invention, if it is used for the detection of charged particles with high luminosity, the N– type changes to the P– type during detection (during measurement). If this phenomenon occurs, the reliability of data is lost during measurement, arising a serious problem. In a semiconductor detector with the structure of this embodiment, even if the P– type slightly changes in specific resistance, it remains the P– type therefore the measurement data is not affected suffer in essence, hence a valuable structure in this regard also.

The terms used in the above descriptions, P– (minus), P± (plus-minus), and P+ (plus), will be now explained. Plus or minus indicates the level of the doping concentration. When there exist regions with the same conductivity type but with different type of concentration in the same semiconductor, these terms are used to distinguish them (including the indication of higher of lower concentration). Plus each term indicates a rough (not strict) range of concentration. For both P and N, P– (minus) indicates roughly the range from $1.45 \times 10^{10}$ (intrinsic) to $1 \times 10^{16}$ cm$^{-3}$, P± (plus-minus) indicates roughly the range from $1 \times 10^{16}$ (intrinsic) to $1 \times 10^{18}$ cm$^{-3}$, and P+ (plus) indicates roughly the range from $1 \times 10^{18}$ (intrinsic) to $1 \times 10^{21}$ cm$^{-3}$ (P++ is possible for the range over this, and P–– is also possible in the same way, in such case as to distinguish the well and the substrate). When the boundary of the regions in the impurity is shown in a section view, a broken line is used if the regions have the same conductivity type but different concentrations, and a solid line is used if the regions have different conductivity type (i.e., to show the pn junction surface).

Figure 29:
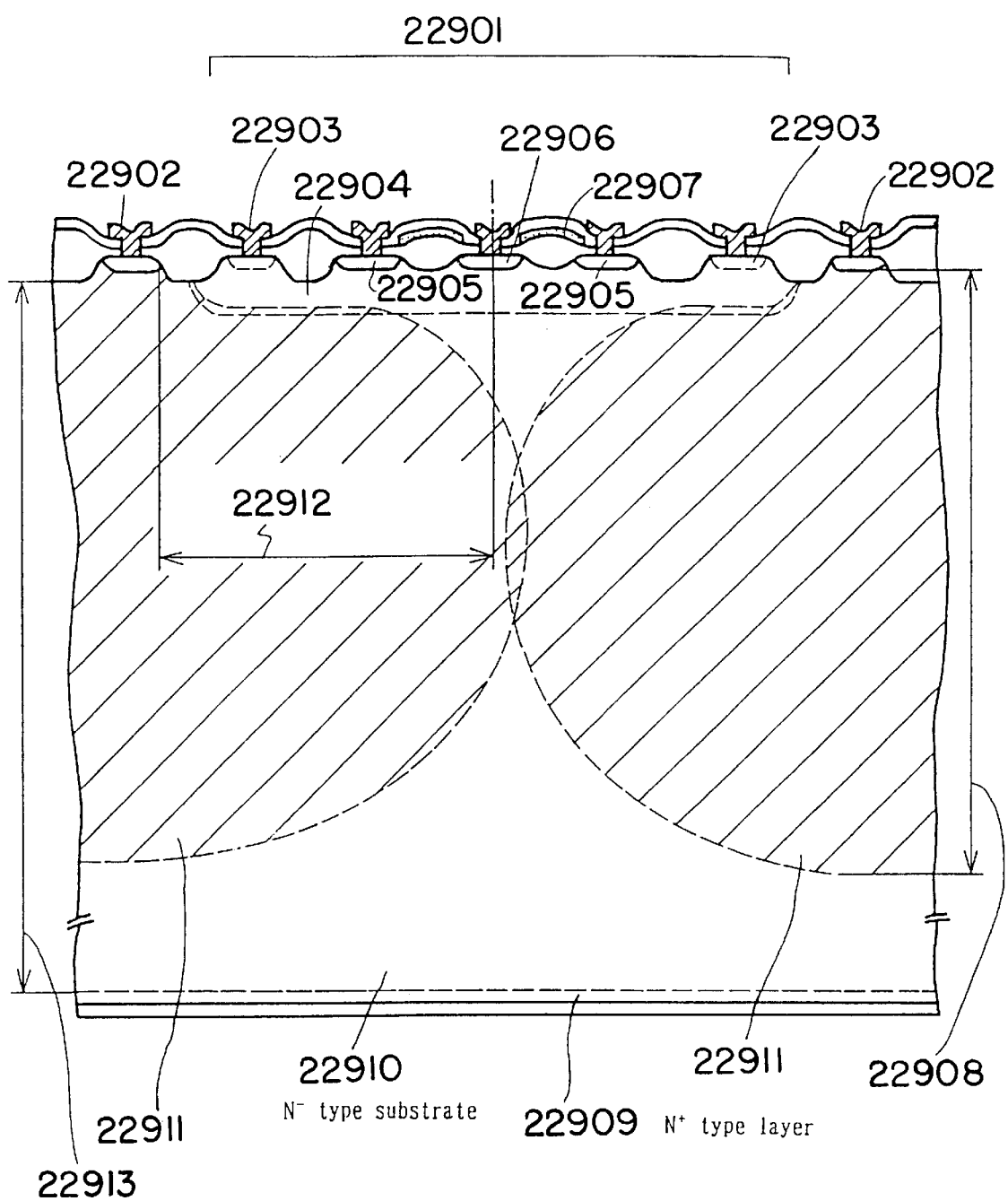
FIG. 29 is a section view showing a first modification of the second embodiment of the present invention.

FIG. 29 is a section view showing the first modification of the semiconductor detector of the second embodiment of the present invention. 22901 indicates the p-channel MOS transistor, 22902 indicates the P+ type layer, 22904 indicates the n-well, 22906 indicates the source region, 22907 indicates the gate electrode, 22905 indicates the drain region, 22909 indicates the N– type layer, 22910 indicates the N– type substrate, and 22911 indicates the deletion layer.

The p-channel MOS transistor of the present invention 22901 is provided in the n-well 22904 formed on the N– type substrate 22910, wherein the gate electrode 22907 and the drain region 22905 are arranged in the shape of concentric circles encircling the source region (electrode) 22906 at the center. Further at the periphery of this p-channel MOS transistor 22901 and on the same surface of the transistor, there is provided the P+ type layer 22902 encircling the transistor on the surface. The P+ type layer 22902 is provided in the N– type substrate 22910 to extend the depletion layer 22911. As described earlier, even if the depletion layer 22911 is formed in the shape of the circular arc touching the end of the P+ type layer, by adopting a structure in which the distance 22912 from the end of the detection element side of the P+ type layer 22902 to the center of the P+ type layer 22906, that is, the source region located at the center of the detection element p-channel MOS transistor is shorter than half the thickness 22908 of the depletion layer to be extended (the thickness of the depletion layer in the direction of the depth; the thickness varies depending on the detection of charged particles or the detection of light. For charged particles, the depletion layer is extended fully to the thickness 22913 of the semiconductor substrate used, namely 300 µm for example in many cases, while for the visible light and infrared light a thickness of several tens µm is sufficient in some cases), the depletion layer covers the lower part of the n-well 22904 and resolves the problem of the non-depleted region (roughly those portion in the N– type substrate 22910 without the hatching showing the depletion layer 22911 in the Figure that exists above the level of the depth of the depletion layer 22908, toward the detection part, depending on the desired thickness of the layer to be extended as described earlier). The use of an epi-wafer or an SOI wafer as substrate is further effective as will be described later.

Figure 30:
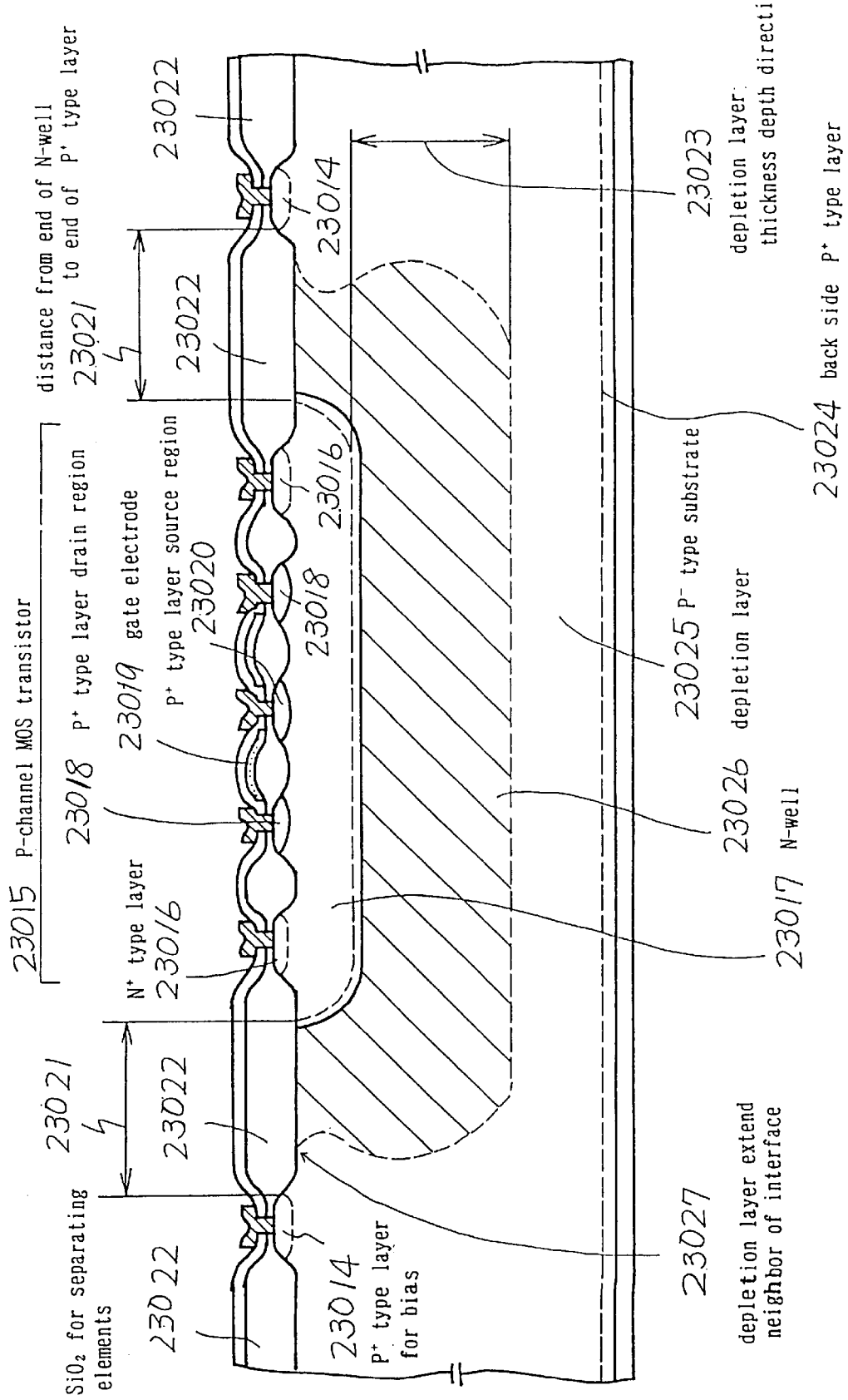
FIG. 30 is a section view showing a second modification of the second embodiment of the present invention.

FIG. 30 is a section view showing the second modification of the semiconductor detector of the second embodiment of the present invention.

22014 indicates the P+ type layer for bias, 23015 indicates the p-channel MOS transistor region, 23016 indicates the N+ type layer for providing the n-well potential, 23017 indicates the n-well, 23018 indicates the drain region consisting of the P+ type layer, 23019 indicates the gate electrode, 23020 indicates the source region consisting of the P+ type layer, 23022 indicates SiO2 for separating elements, 23024 indicates the back-side P+ type layer, 23025 indicates the P– type substrate, 23026 indicates the depletion layer, 23021 indicates the distance from the end of the n-well 23017 to the P+ type layer for bias 23014, 23023 indicates the thickness of the depletion layer in the direction of the depth, and 23027 indicates the portion where the depletion layer is extended in the neighborhood of the surface.

The p-channel MOS transistor region 23015 which is the detection element part of the present invention uses a P– type substrate 23025 (with a concentration and a specific resistance determined depending on the application and the desired characteristics), and is formed in the n-well 23017 formed in the substrate. The gate electrode 23019, the drain region 23018 and the others are arranged in the shape of concentric circles encircling the source region 23020 in the same way as in FIG. 29.

By adopting this structure, the depletion layer 23026 is electrically formed, with the junction of the n-well 23017 and the P– substrate 23025 being the maximum electric field, mainly to the side of the substrate, to have the desired thickness in the direction of the depth 23023 as described earlier. The electric potential of the P– type substrate may be provided either from the P+ type layer for bias 23014 on the detection element side or from the back-side P+ type layer 23024. As described earlier, the depletion layer may extend in the neighborhood of the surface occurs as is indicated by 23027 (tendency of inversion as opposed to an N– type substrate) depending on Qss of the surface (the surface between the thick SiO2 for separating elements 23022 and the substrate), therefore it is preferable to make the distance 23021 from the end of the n-well to the P+ type layer for bias 23014 longer than the desired thickness 23023 of the depletion layer to be extended. Also, it is further practical to provide a P– type region under the thick SiO2 for separating elements as will be described for FIGS. 31 to 32. In this case also the above distance is preferable.

Beside the several advantages of this structure with regard to the manufacturing as is described for the first embodiment, the structure permits the integration of the subsequent signal processing circuit into one chip (that is the formation of the signal processing electric circuit in CMOS or others on the same semiconductor) as will be described for FIGS. 31 to 32.

Figure 33:
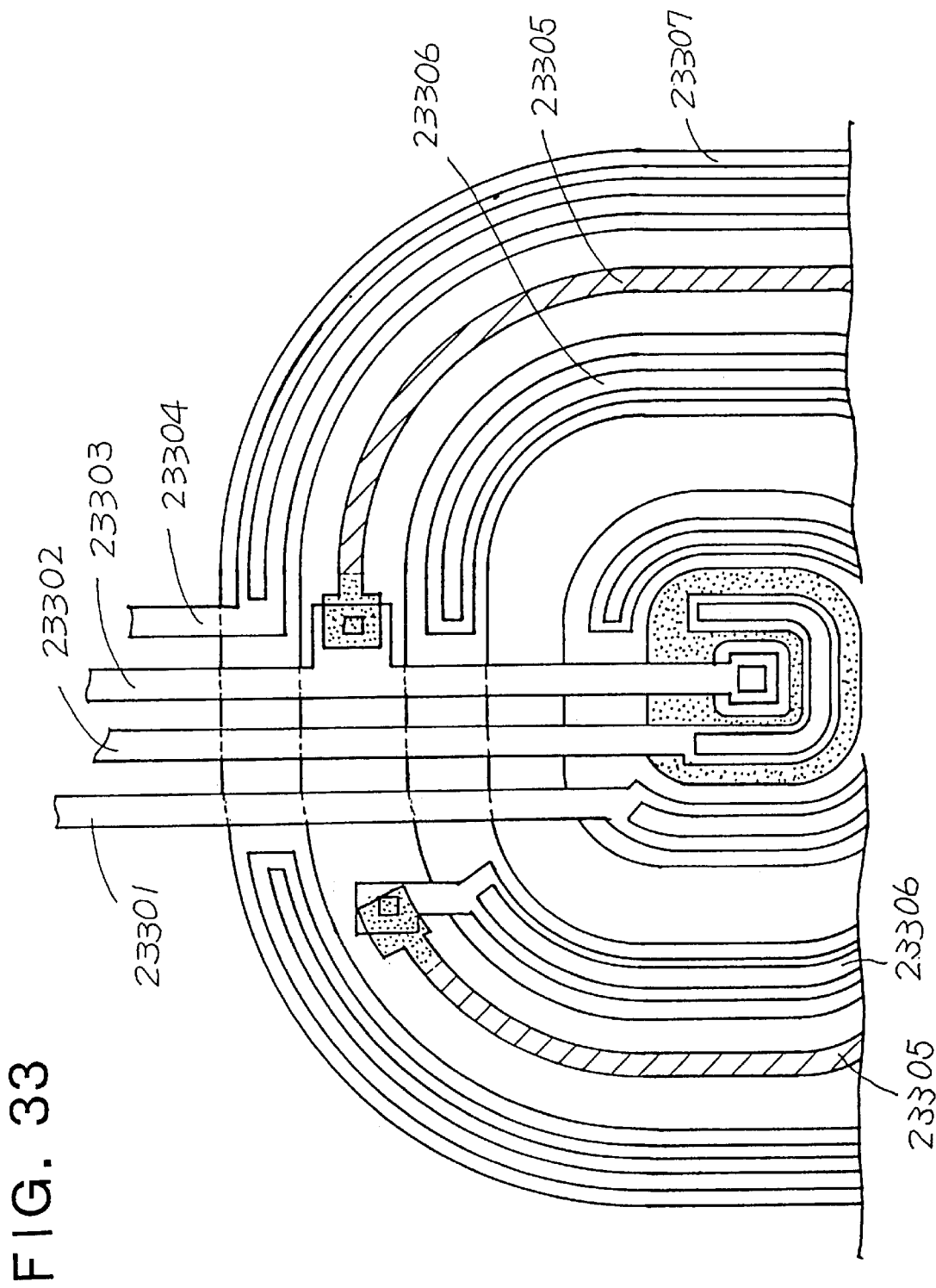
FIG. 33 is a plan view relating to one example of the second modification of the second embodiment of the present invention.

This example is particularly suitable for the element of light reception such as infrared radiation, as a thickness of the depletion layer of 30 to 40 μm is sufficient in many of such applications. However, in the case of the detection of charged particles, when the depletion layer needs to be extended to 2 to 300 μm, a longer distance 23021 is disadvantageous with regard to the area (a larger pitch and a lower resolution when a plurality of elements is integrated). Therefore in that case the example of FIG. 29 is more preferable. An example of the structure on the plane is shown in FIG. 33.

Figure 31:
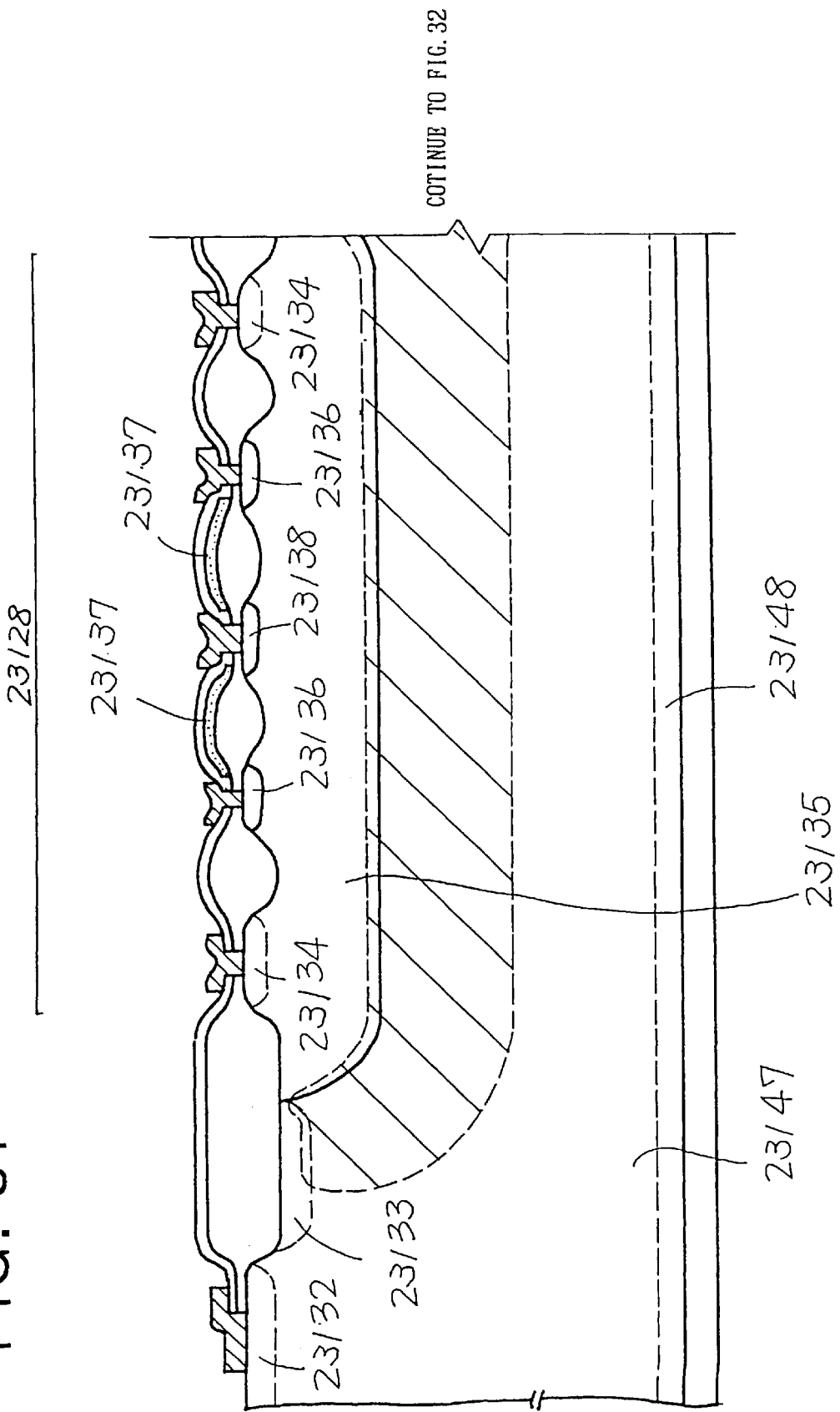
FIG. 31 is a partial section view of the detection part of the semiconductor device of the second modification of the second embodiment of the present invention in which the signal processing circuit is formed in the same substrate.
Figure 32:
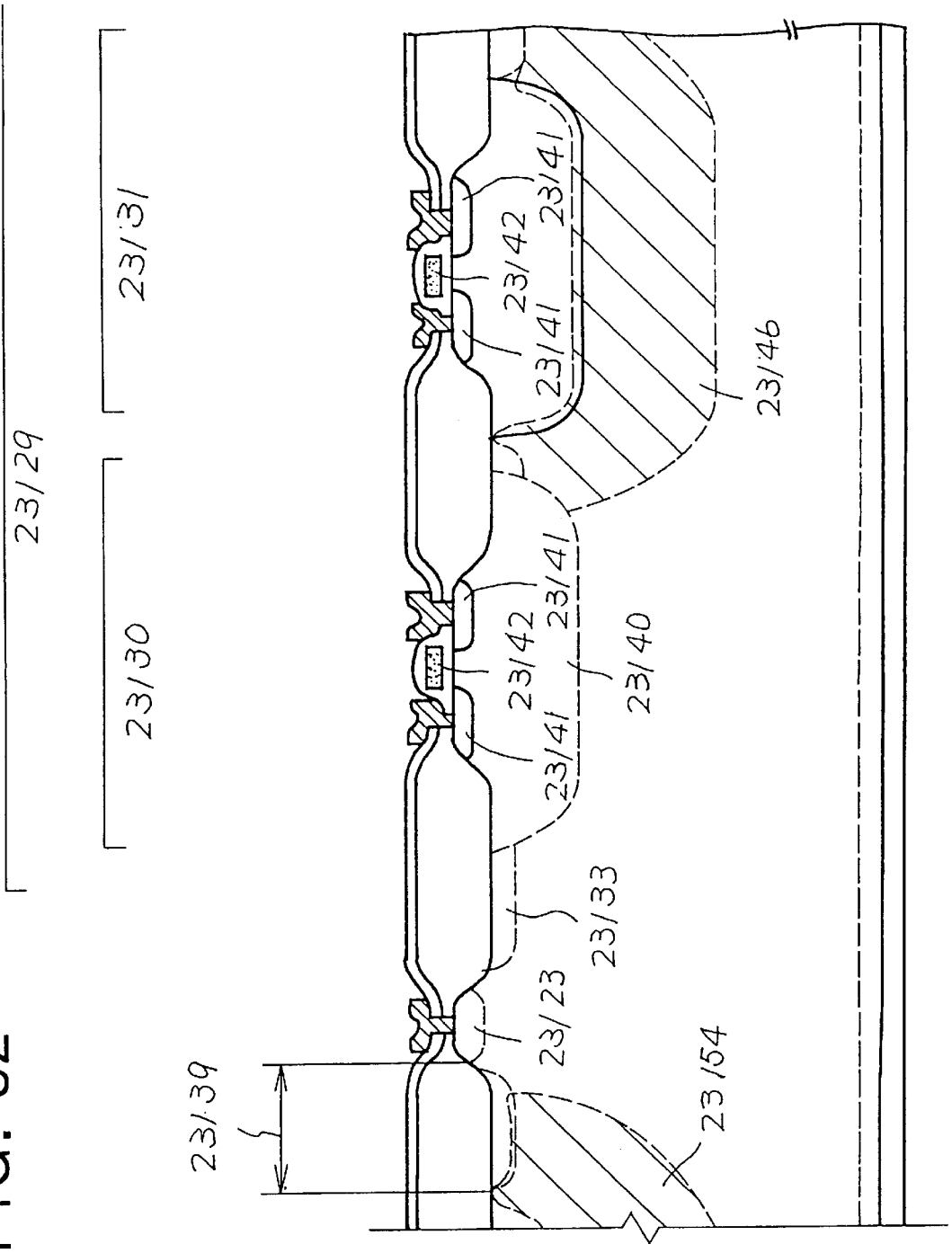
FIG. 32 is a partial section view of the signal processing circuit in the semiconductor device of the second modification of the second embodiment of the present invention in which the signal processing circuit is formed in the same substrate.

FIGS. 31 and 32 are section views of the semiconductor device in which the second modification of the semiconductor device of the second embodiment of the present invention and a signal processing circuit are formed in the same substrate. The device is shown in two FIGS. by separating it due to the limitation of the page layout; FIG. 31 shows the detection element part shown in FIG. 30, and FIG. 32 shows the signal processing circuit. The two Figs will now be explained at the same time.

23128 indicates the p-channel MMOS transistor, 23129 indicates the signal processing circuit consisting of the CMOS part, 23130 indicates the NMOS of the signal processing circuit, 23131 indicates the PMOS of the signal processing circuit, 23132 indicates the P+ type layer, 23133 indicates the P± type layer, and 23134 indicates the N+ type layer, which is provided to make the n-well potential indicated by 23135. 23136 indicates the drain region consisting of the P+ type layer, 23137 indicates the Poly Si gate electrode, 23138 indicates the source region consisting of the P+ type layer, 23140 indicates the p-well region for NMOS transistor (which may be unnecessary depending on the concentration of the P– substrate), 23141 indicates the source or drain region of NMOS, the N+ type layer, 21142 indicates the NMOS gate Poly Si electrode, and 23143 indicates the n-well 2 region for PMOS transistor in the CMOS circuit part. It is convenient if the concentration is the same as the concentration of the n-well for light-reception PMOS since manufacturing process can be simplified, but the concentration is determined depending on the desired characteristics. If the depletion layer 23146 formed between the n-well 2 and the P– type layer by means of the power supply voltage of the circuit part extends so much as to affect the others (for example to force the distance to the p-well for NMOS to be so large as to be impractical) depending on the circuit power supply and on the P– type layer concentration, it becomes necessary to provide a second p-well region to cover the n-well 2 totally as described later. The back-side P+ type layer 23148 is an indispensable region, even when the whole is structured only on a single side as is the case of this example, in order to avoid the unnecessary inversion layer on the back side and the resulting unnecessary diffusion current. 23144 indicates the source or drain region consisting of the P+ type layer, 23145 and 23146 indicate the depletion layer, 23147 indicates the P– type substrate, and 23148 indicates the back-side P+ type layer.

The p-channel MOS transistor 23128 formed in the P– type substrate 23147, which is the detection element (light reception part) of the present invention, is surrounded by the P+ type layer for bias 23132 (for the formation of the depletion layer). In the same the P– type substrate there are formed NMOS 23130 and PMOS 23131 constituting the signal-processing CMOS circuit 23129 as is shown in FIG. 32. (NMOS and PMOS only are illustrated symbolically for CMOS part; actually there is a plurality of them, and the structure that further contains resistance elements and capacitance elements arranged with complexity on the surface is equivalent to an LSI.)

Under the thick SiO2 for separating elements there is provided the P– type layer 23133 as is described for the first embodiment, preventing the electrical separation between the elements and the inversion at the surface which is described for FIG. 29.

This structure achieves a one-chip light-reception IC. The dimension 23139 from the end of the n-well to the closest end of the P+ type layer is determined according to the desired thickness of the depletion layer 23145 as described for FIG. 30.

FIG. 33 is a plan view showing one example of the light-reception part of the second modification of semiconductor detector of the second embodiment of the present invention. 23301 indicates the drain electrode, 23302 indicates the gate electrode, 23303 indicates the source electrode, 23304 indicates the P+ type layer electrode, and 23306 indicates the n-well electrode. For the simplicity purpose, the lower half of the concentric circles are omitted from the Figure.

In addition to all the layers including the P+ type layer for bias 23307 that are arranged in the shape of the concentric circles as is described for FIG. 22 and FIG. 24, Poly Si resistance (RB) 23305 is further located in the space in the shape of a concentric circle to save the area.

Figure 34:
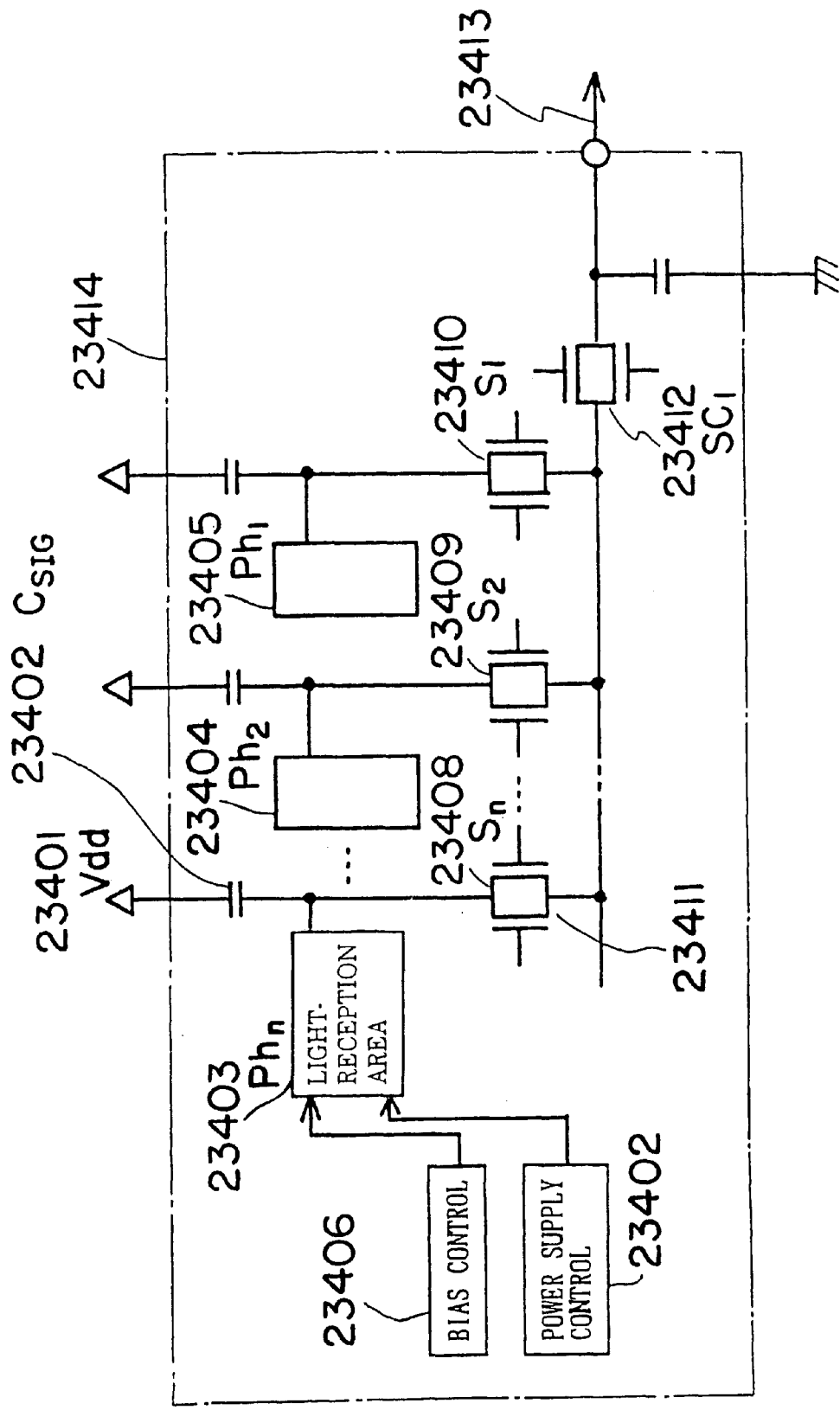
FIG. 34 is a block diagram showing one example of the read-out circuit of the second embodiment of the present invention.

FIG. 34 is a block diagram showing the first application example of the read-out circuit of the second embodiment of the present invention. 23414 indicates a light-reception IC (image sensor) consisting of one chip, wherein the light-reception parts which are equivalent to the light-reception part 11313 shown in FIG. 13 are arranged as are illustrated by Ph1 23405, Ph2 23404, . . . Phn 23403, which is of the ordinal number of n. They are selected by the time-division method by analog switches S1 23410, S2 23409 . . . Sn 23408, which are arranged in the same way as the light-reception parts, and the signals are output through the analog switch SC1 23412 to the output part 23413. 23401 indicates Vdd, 23402 indicates the storage capacitance CSTG, 23406 indicates the bias control part for the light-reception part, and 23407 indicates the power supply control part for the light-reception part.

Next we will discuss the field of the optical communications which has been in increasing use in recent years. Optical communications is divided into two methods: communication method that uses optical fiber and space optical transmission which transmits signals in the space through the use of infrared radiation and others like remote control. The transmission method falls into two large categories: baseband method and carrier method. The communications by fiber and the space optical transmission both have the baseband method and the carrier method. The signals handled are mainly digital signals for the baseband method, and digital or analog signals depending on the modulation method for the carrier method (the detector of charged particles and image sensor IC, which have been described so far, are mainly detectors of analog value.) In this sense the classification between the real-time monitoring and time-division monitoring is not appropriate (because if the SC circuit is used like active filter, the time-division image is obtained as described later), the signal processing circuit of the first stage can be classified into real-time monitoring. An example of application of the semiconductor detector for the optical communication will be now described as the second application example. It is a different circuit from the two-dimension real-time detection for charged particles.

Figure 35:
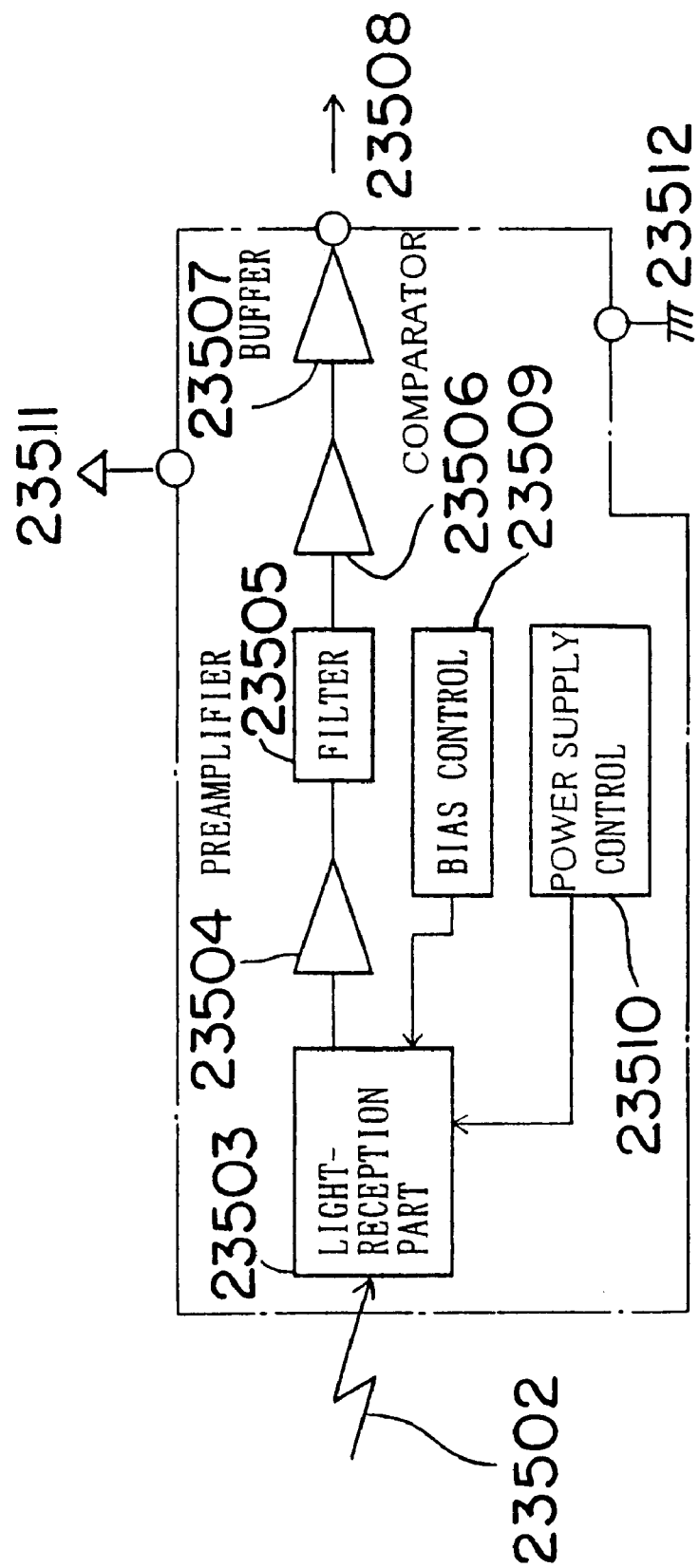
FIG. 35 is a system block diagram showing the circuit in base band transmission method of the semiconductor device of the second application example of the second embodiment of the present invention.

FIG. 35 is a system block diagram showing a circuit of the semiconductor device in the case of baseband transmission of the second application example of the second embodiment of the present invention. The Figure illustrate a one-chip light-reception IC 23501 which consists of the light-reception part of the present invention 23503, a preamplifier part 23504, a filter part 23505, a comparator part 23506, a buffer 23507 and in relation to the light-reception part, a bias control circuit part 23509 and a power control circuit part 23510. 23502 indicates incident infrared radiation, 23508 indicates the output electrical signal, 23511 indicates Vdd and 23512 indicates GND. The light-reception element of the present invention is used in this circuit structure to provide a one-chip light-reception IC.

Baseband transmission uses digital signals to represent the presence/absence of the infrared radiation as opposed to the carrier type described later. The bias control circuit and the power control circuit of the light-reception part will be described later.

Figure 36:
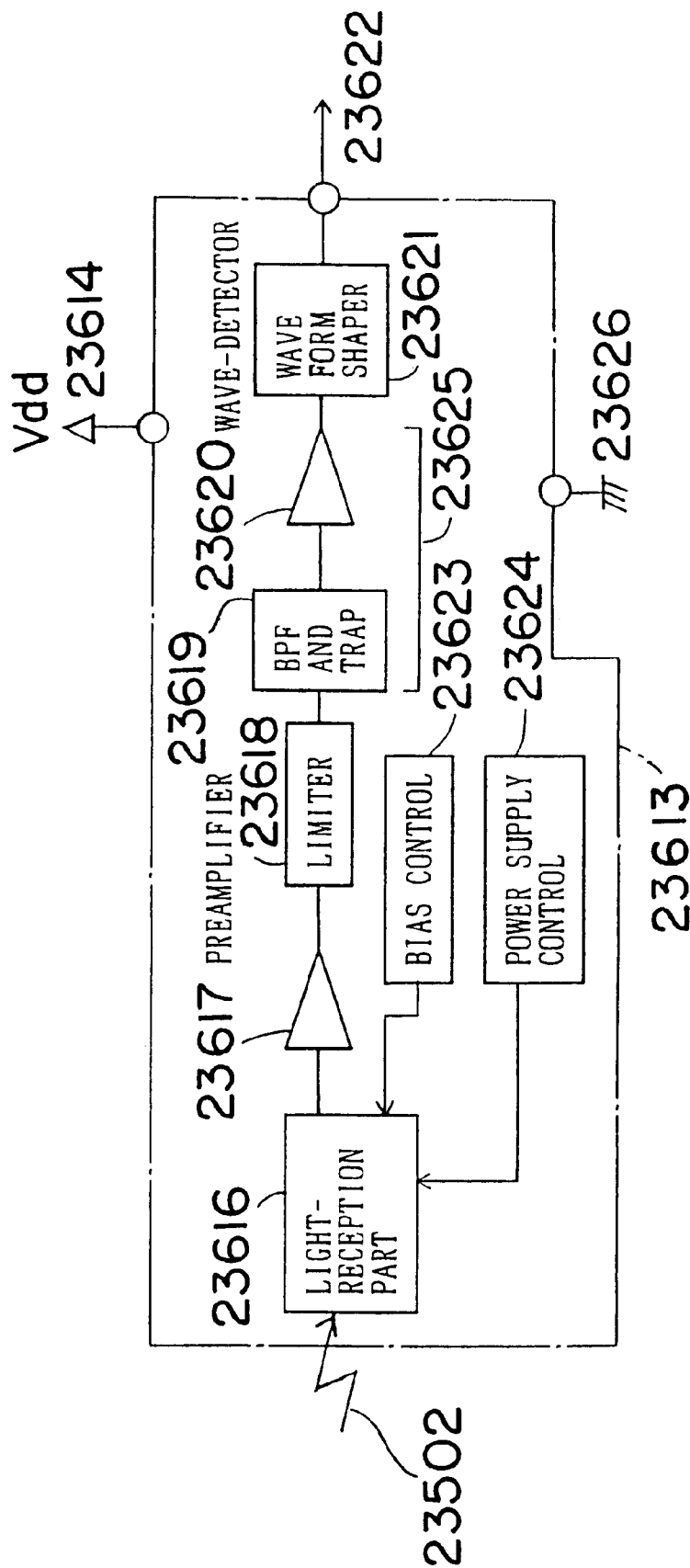
FIG. 36 is a system block diagram showing the circuit in carrier transmission method of the semiconductor device of the second application example of the second embodiment of the present invention.

FIG. 36 is a system block diagram showing a circuit of the semiconductor device in the case of carrier transmission of the second application example of the second embodiment of the present invention. The Figure illustrates a one-chip light-reception IC 23613 of the present invention which consists of the light-reception part 23616, a preamplifier part 23615, a limiter part 23618, a BPF and trap part 23619, a wave-detector part 23620, a waveform shaper 23621 and in relation to the light-reception part a bias controller part 23623 and a power control circuit part 23624. 23615 indicates incident infrared radiation, 23622 indicates the output electrical signal, 23614 indicates Vdd and 23626 indicates GND. BPF is the abbreviation of Band Pass Filter, and the trap is a function to mask noise from a high-frequency fluorescent lamp for example by means of synchronous signal. Particularly it is further convenient to construct this BPF and trap part and the wave detector 23625 into an active filter by means of SC (switched capacitor) circuit if they are structured by a CMOS circuit. Carrier transmission method is to modulate the carriers of the infrared radiation using methods such as ASK (amplification shift keying), PSK (phase shift keying), PFSK (phase frequency shift keying), and QPSK (quad phase shift keying). The light-reception IC of the present invention is the first-stage IC to demodulate them. The carrier method is used for remote control for household electric appliances (carrier of several tens kHz), wireless headphone, speaker, and for FA, DA (several hundreds kHz). The investigation of application to the data communication between PDA (personal data assistant) and PHS (personal handyphone system) and the computer has been already started. Standards such as IrDA (Infrared rays Data Association) and standardization are also being investigated. Carrier frequency is shifting to 4 MHz, 10 MHz or several tens MHz. Therefore an integrated circuits using the light-reception part of the present invention will become more and more useful.

Figure 37:
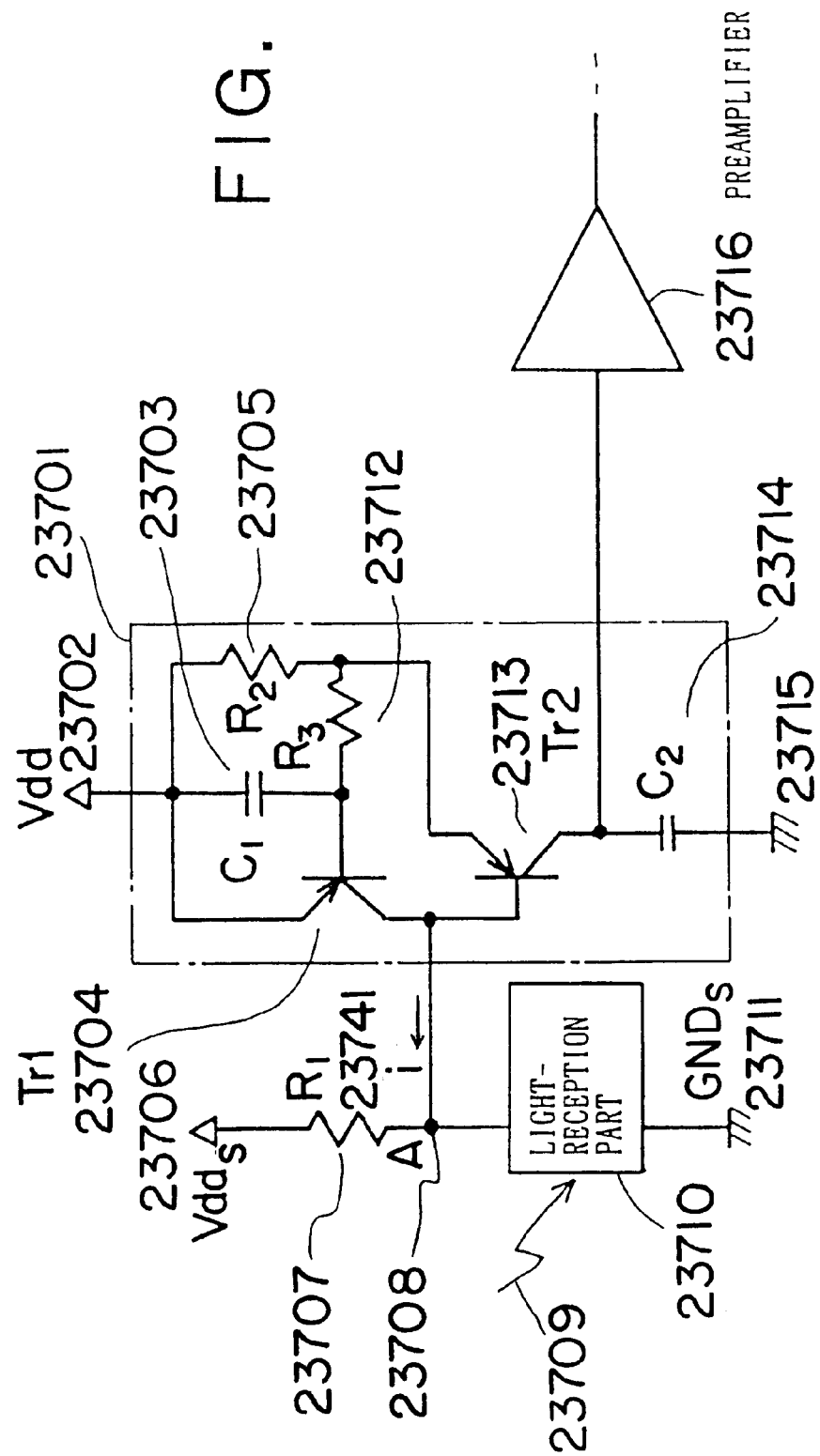
FIG. 37 is a block diagram of one example of the semiconductor device of the second application example of the second embodiment of the present invention with a bias control circuit part having a bipolar structure.

FIG. 37 is a block diagram of one example of the semiconductor device of the second application example of the second embodiment of the present invention with a bias control circuit part having a bipolar structure. The light-reception part of the present invention is connected via a series resistance R1 23707 to Vdds (the power supply system of the light-reception part is called Vdds and GNDs to distinguish them from Vdd and GND of the circuit, because the power supply control circuit is related as described later).

The signals are input directly from Point A 23708 in the Figure to the preamplifier 23716 in the previous examples. In the case that the light-reception part is located below the series resistance as shown in this Figure, point A becomes Lo (GNDs) level when the light signal falls on, and becomes Hi (Vdds) level when there is no incident light (when it is dark). Such connection will be referred to as sink connection in this specification. On the other hand, in the connection where light-reception part is connected to Vdds and the series resistance is located below the light-reception part, point A becomes Hi (Vdds) when the light signal falls on and becomes Lo (GNDs) when there is no incident light. Such connection will be referred to as follower connection. In the latter case, if the series resistance R1 is set to 10 k to 100 kΩ for example, the average current dissipation is as much as approx. 100 μA when calculated under the given conditions. Thus if the R1 is set to 1MΩ to 5 MΩ for example, the current dissipation is reduced but the light saturation is accelerated (dynamic range is narrowed) plus there arise the problem of the selectivity of signal with regard to the DC light (that is the ambient light such as sunlight outdoors or room light existing in the room) and the problem of increase in the average current dissipation due to the DC light itself. Therefore a circuit such as that of the present invention is desirable which responds largely to the current amplitude with regard to the signal (carrier) light while flows little current with regard to the DC light. Such circuit will be referred to as passing differential amount change amplification circuit. In this example, a circuit is shown which consists of a pnp transistor Tr1 23704, a pnp transistor Tr2 23713, a capacitor C1, a resistance R2 23705, a resistance R3 23712, and a capacitor C2 23714. When the DC light falls on, current i 23741 flows only by a current determined by hFE of PNPTr1 . . . On the other hand, when carrier light falls on, the electric potential at point A moves in the manner of AC, then the circuit consisting of the resistances R2, R3, the capacitances C1, and Tr1, Tr2 operates in a large amplitude, thereby inputting a signal of a larger amplitude to the preamplifier 23716 than when only the DC light falls on. 23709 indicates incident infrared radiation, 23702 indicates Vdd of the circuit part, and 23715 indicates GND of the circuit part.

Figure 38:
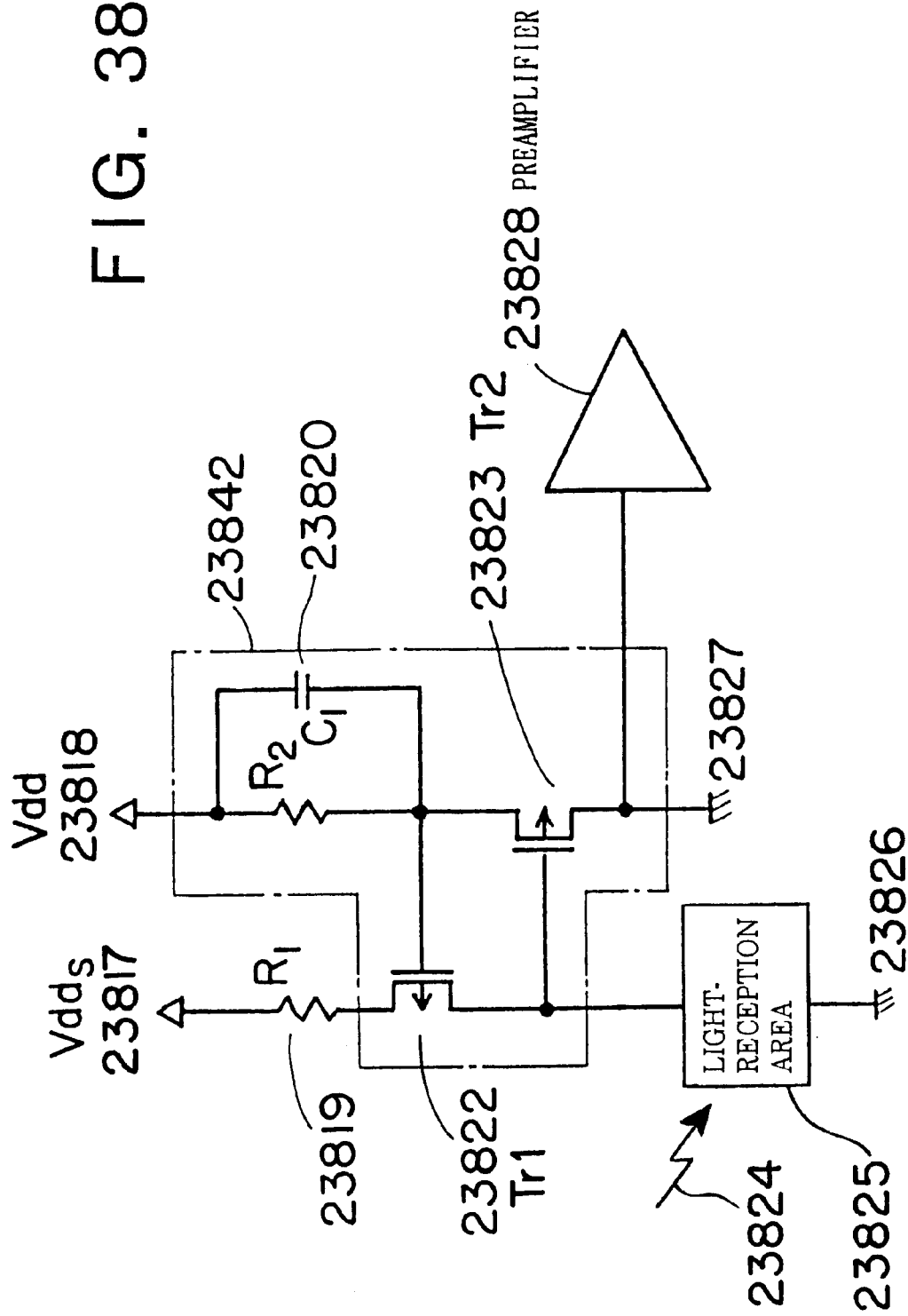
FIG. 38 is a block diagram of one example of the semiconductor device of the second application example of the second embodiment of the present invention with a bias control circuit part having a MOS structure.

FIG. 38 is a block diagram of one example of the semiconductor device of the second application example of the second embodiment of the present invention with a bias control circuit part having a MOS structure. The circuit consists of MOS elements and operates in a similar manner to the circuit shown in FIG. 37. 23817 indicates vdds, 23818 indicates Vdd, 23819 indicates a series resistance R1, 22820 indicates a capacitor C1, 23821 indicates a resistance R2, 23822 indicates a p-channel MOS transistor Tr1 constituting a bias control circuit 23842, 23824 indicates the infrared radiation input, 23825 indicates the light-reception part of the present invention, 23823 indicates a p-channel MOS transistor Tr2, 23828 indicates a preamplifier, 23826 indicates GNDs and 23827 indicates GND.

Figure 39:
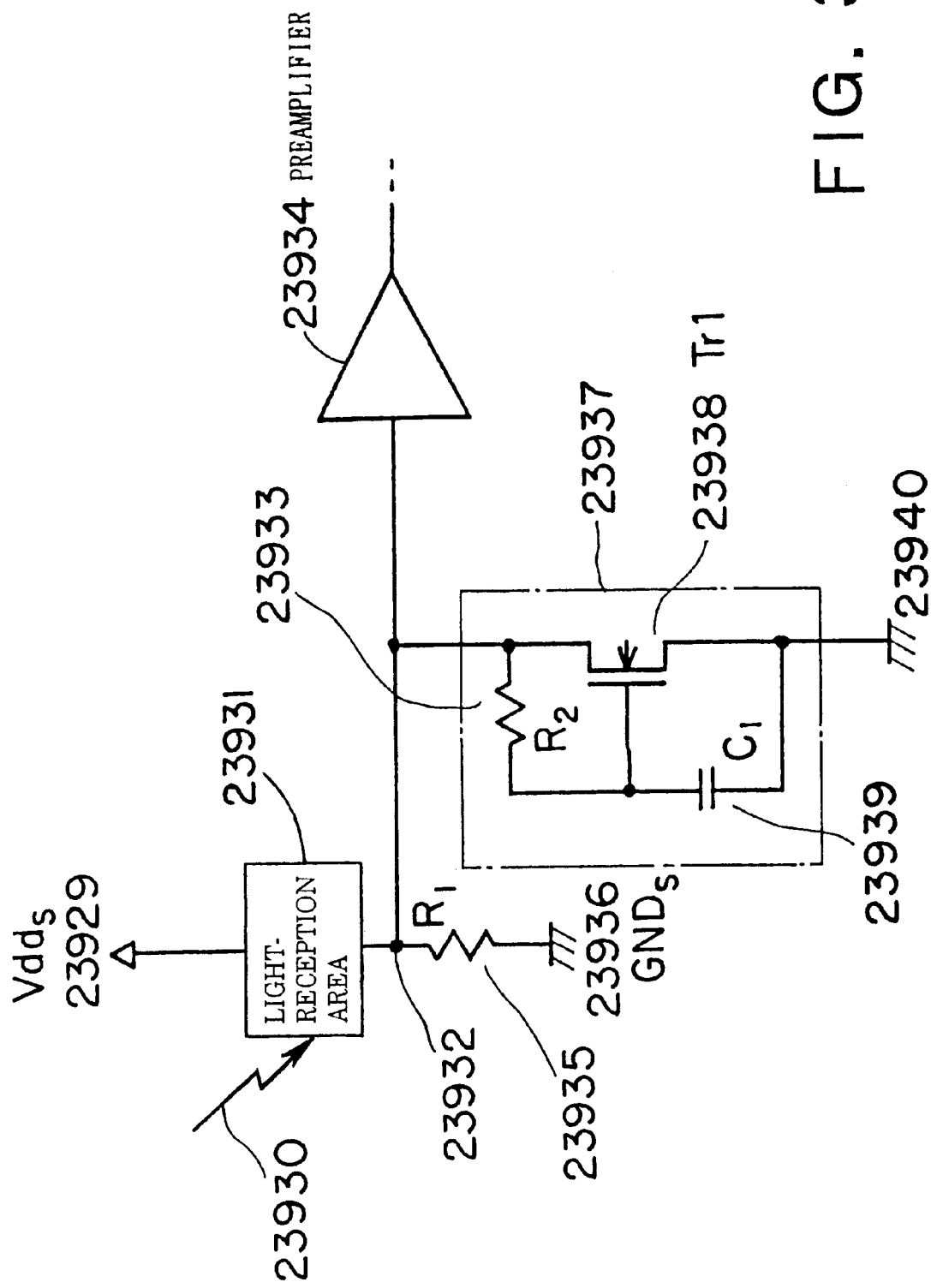
FIG. 39 is a block diagram of one example of the semiconductor device of the second application example of the second embodiment of the present invention with a bias control circuit part having a MOS structure and with the light-reception part of follower connection.

FIG. 39 is a block diagram of one example of the semiconductor device of the second application example of the second embodiment of the present invention with a bias control circuit part having a MOS structure and with the reception part of follower connection.

The bias control circuit consists of a resistance R2 23933, an n-channel MOS transistor 23938 and a capacitance C1 23939. Even when the series resistance R1 23935 has a resistivity of 30 k to 100 kΩ, the differential passing amount amplification circuit can sufficiently reduce the current dissipation due to the DC light. The description of this circuit will not be given here as the circuit configuration is simple and the operation is easy to understand. This circuit is practical as there is little noise generation owing to simple circuit structure.

23929 indicates Vdds, 23931 indicates the light-reception part of the present invention, 23930 indicates the incident infrared radiation, 23932 indicates point A, 23936 indicates GNDs, and 23934 indicates a preamplifier.

Figure 40:
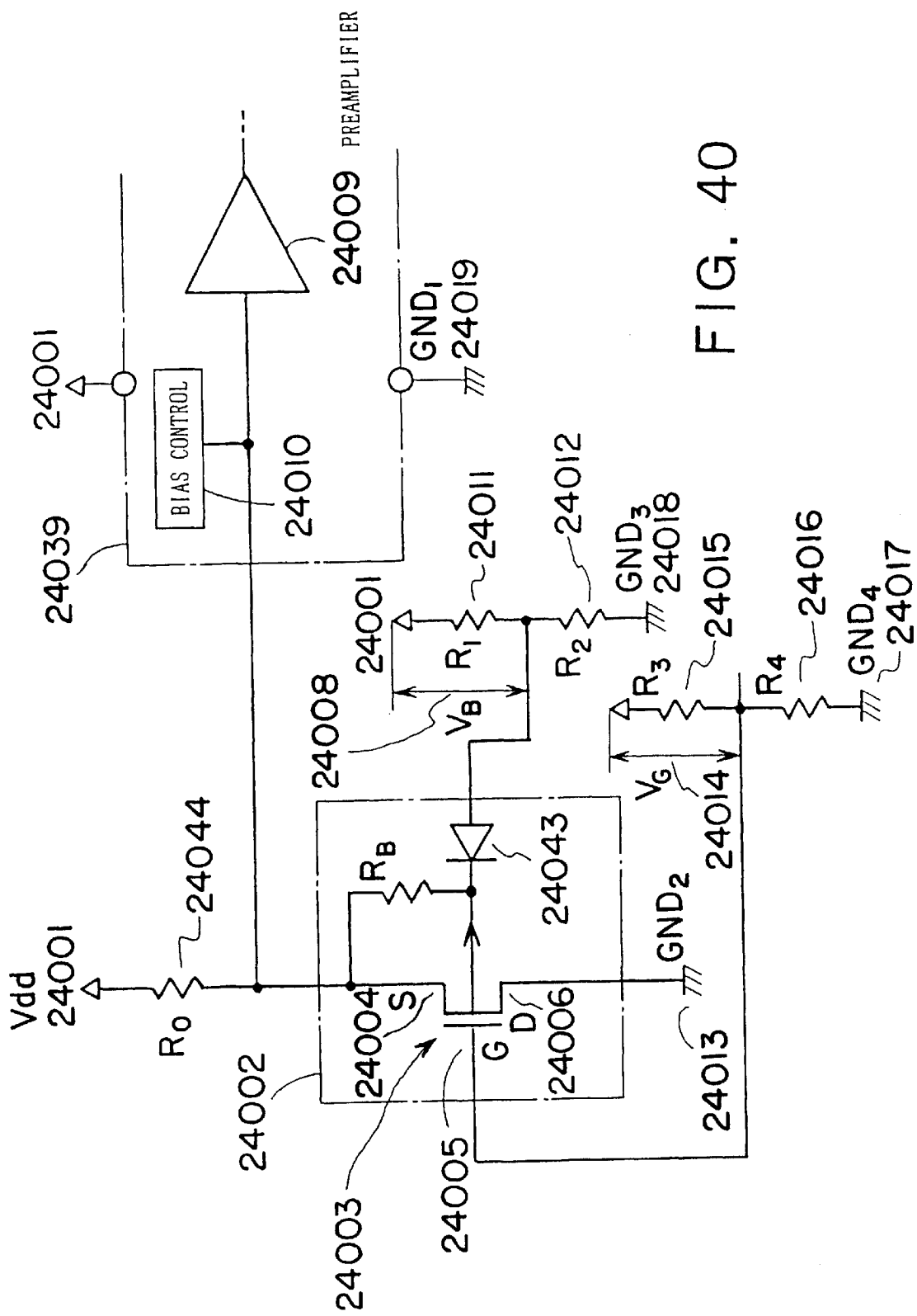
FIG. 40 is a block diagram of the semiconductor device of the second application example of the second embodiment of the present invention using an N– substrate for the power supply control circuit.

FIG. 40 is a block diagram of the semiconductor device of the second application example of the second embodiment of the present invention using an N substrate for the power supply control circuit.

The p-channel MOS transistor 24003 of the present invention which consists of a source S 24004, a gate G 24005, a drain D 24006, RB 24007, and a pn junction for bias 24043 represents the light-reception part 24002, and is sink-connected to Vdd 24001 via a series resistance Ro. The signal from the light-reception part is transmitted through a signal line 24043 to a signal processing circuit 24039 consisting of a bias control circuit 24010, Vdd 24001, GND1 (or called Vss1, Vss2 for multiple power supply such as this example) 24019, and a preamplifier 24009. To the gate voltage VG 24017 and the bias voltage VB 24008, a voltage divided by the resistance R3 24015 and the resistance R4 24016 between Vdd 24001 and GND4 24017 and a voltage divided by the resistance R1 24011 and the resistance R2 24012 between Vdd 24001 and GND3 24018 are applied respectively as shown in the Figure. The Figure schematically represents the way by which a bias different from the bias between Vdd–GND2 24013 which is applied to the light-reception part p-channel MOS transistor may be applied to VG or VB arbitrarily. Naturally it also represents that GND2 is different from GND1. It is self-evident that if the light-reception part and the signal processing circuit are integrated into one chip using an N– substrate with multiple power supply, Vdd becomes the reference voltage in any way. On the other hand, GND2, GND3, and GND4 may be provided by an external circuit or may be made internally from the highest (in the negative direction) GND (roughly Vin) by regulating it. In this sense, the Figure is intended to show that regulated multiple power supplies (multiple types of voltage) are provided for VG and VB. Thereby VG and VB are given a negative potential in the wide range of freedom in the p-channel MOS transistor of the light-reception part of the present invention, allowing the setting for optimum characteristics. However in case of Vdd reference, for the processing in the signal processing circuit and thereafter, change to GND1 (GND of the external circuit) reference may be necessary in the final stage. Naturally it is more preferable to set VG and VB with one uniform GND if possible.

Figure 41:
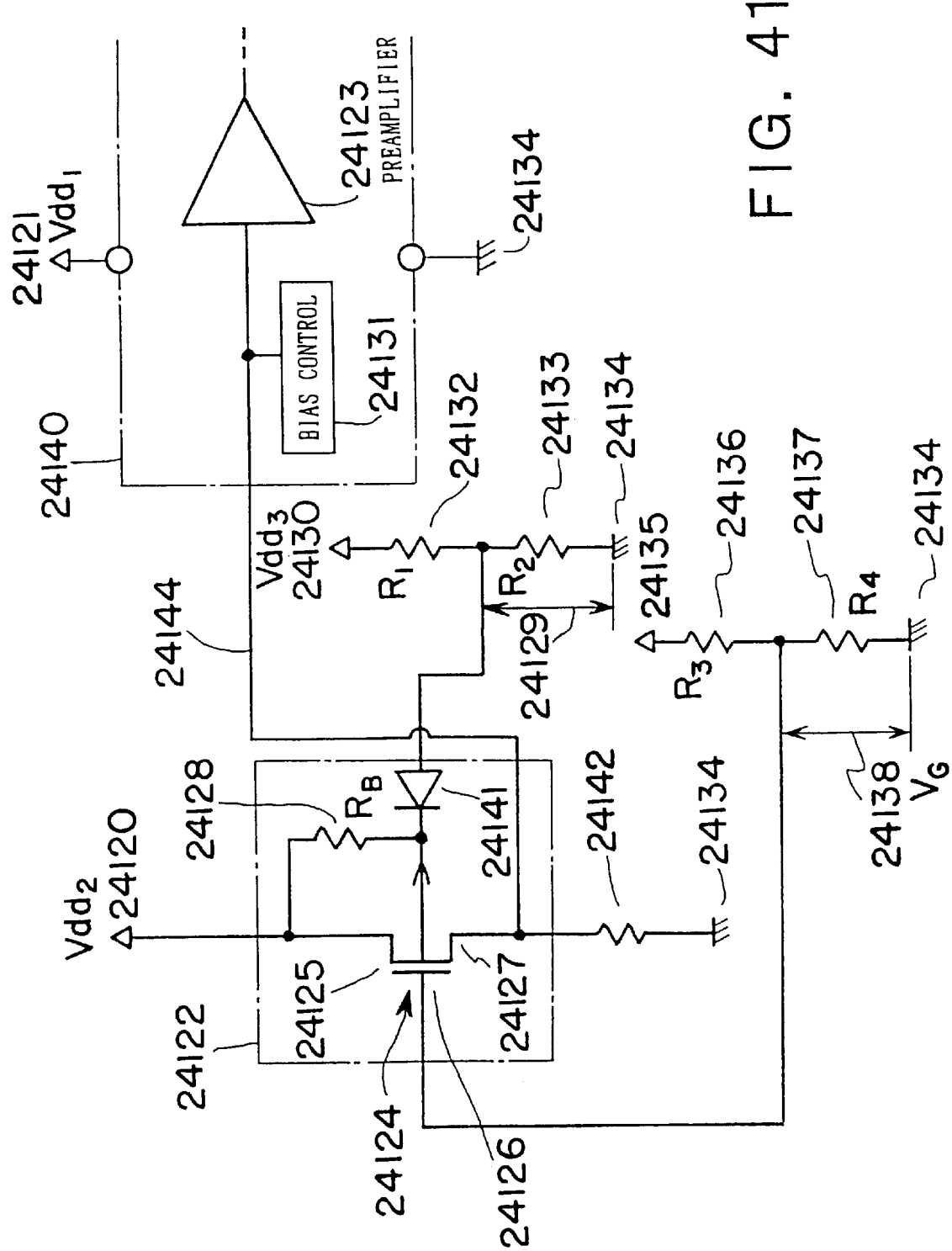
FIG. 41 is a block diagram of the semiconductor device of the second application example of the second embodiment of the present invention using a P– substrate for the power supply control circuit.

FIG. 41 is a block diagram of the semiconductor device of the second application example of the second embodiment of the present invention using a P– substrate for the power supply control circuit.

The p-channel MOS transistor 24124 of the present invention which consists of a source S 24125, a gate G 24126, a drain D 24127, RB 24128, and a pn junction for bias 24141 represents the light-reception part 24122, and is follower-connected to GND 24134 via a series resistance Ro 24142. The signal from the light-reception part is transmitted through a signal line 24144 to a signal processing circuit 24140 which consists of a bias control circuit 24131, Vdd1 24121, GND 24134, a preamplifier 24123 and others. To the gate voltage VG 24138 and the bias voltage VB 24129, a voltage divided by the resistance R3 24136 and the resistance R4 24137 between Vdd4 24135 and GND 24134 and a voltage divided by the resistance R1 24132 and the resistance R2 24133 between Vdd3 24130 and GND 24134 are applied respectively as shown in the Figure. The Figure schematically represents the way by which a bias different from the bias between Vdd2 24120—GND which is applied to the light-reception part p-channel MOS transistor may be applied to VG or VB arbitrarily. Naturally it also represents that Vdd2 is different from Vdd1. It is self-evident that if the light-reception part and the signal processing circuit are integrated into one chip using a P– substrate with multiple power supply, GND becomes the reference voltage in any way. On the other hand, Vdd2, Vdd3, and Vdd4 may be provided by an external circuit or may be made internally from the highest (in the negative direction) Vdd (roughly Vin) by regulating it. It may be most practical at present to construct this circuit using the structure of FIG. 30. However, in a structure, such as the structure of this example, where the series resistance Ro is on the GND side, certainly there is much degree of freedom as VG and VB can be set negative as well with regard to the source, but the resistance cannot have a large resistivity because the P– type substrate is used. To make up for this (to reduce the current drain due to the DC light), the common use with the bias control circuit is valuable. If the resistance Ro is on the Vdd side, a resistivity as large as desired can be structured by using a Poly Si resistance and so on. In that case, VG and VB cannot make a potential lower than GND, therefore there is no freedom in the setting of the characteristics of the p-channel MOS transistor. Yet in that case multiple power supplies become meaningless at the same time, so it is preferable to use this. In the present invention the example of the use of an SOI substrate is described. Although the use of an SOI substrate is not illustrated in the drawings with regard to one-chip integration and multiple power supplies, if an SOI substrate is used, the elements such as the detection elements and the circuit elements can be separated (dielectric separation) by means of thick LOCOS, SiO2, or a trench, thereby further increasing the practical effectiveness.

The examples have been described above in conjunction with the method for integration into one chip. The present invention naturally discloses that in the case that the signal processing circuit is not on the same substrate of the p-channel MOS transistor which constitutes the light-reception part also, it is effective to construct the circuit using a bias control circuit (passing differential amount amplification circuit) to construct a device, and that in that case the light-reception part may be a p-i-n diode or an npn transistor.

Figure 42:
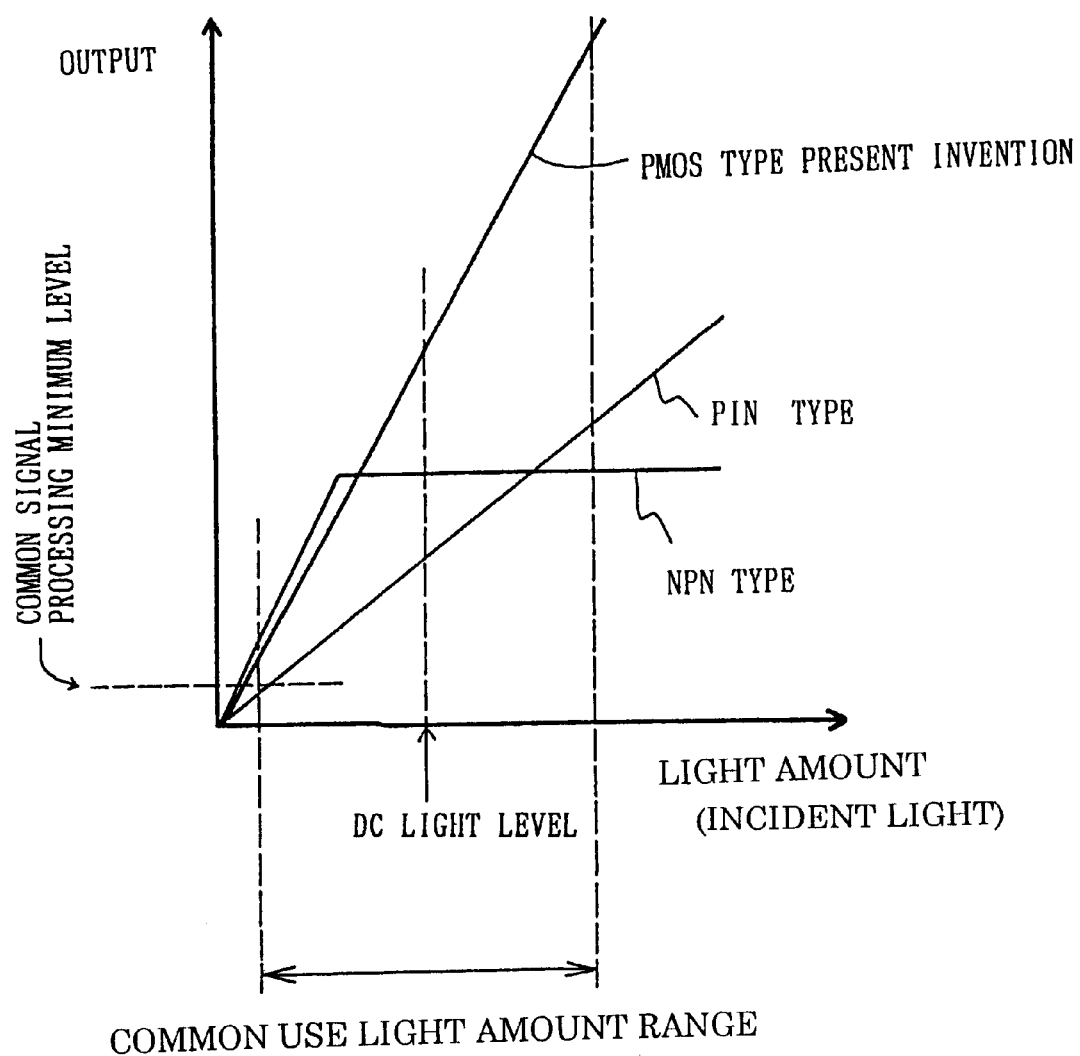
FIG. 42 is a graph showing the output characteristic versus incident light amount according to the present invention.

FIG. 42 is a graph showing the output characteristic versus incident light amount in the present invention.

So far the first and the second embodiment and their application examples have been described. Now the description will be done using a graph in which the detection element of the present invention is compared with other common detection elements in characteristics. As is apparent from the Figure, the p-i-n type has the lowest output for light amount (because there is no gain), while the npn type has a high output at rising (when there is a small amount of light) but saturates when a certain level of light amount is reached. Assuming that the light amount used is in the illustrated range, the output of the p-i-n type is lower than the minimum level of the common signal processing level when the light amount is the lowest level. If the area is extended to raise the output, increase in junction capacitance causes reduction in speed and increase in leak current (dark current), with the result of the deterioration of signal-to-noise ratio, hence the element becomes hard to handle, The extended area also leads to cost increase. The npn type has a good rising characteristics but the output for light amount saturates (light saturation). This means dynamic range cannot be set to be wide. Light saturation at a point under the DC light level as shown in Fig. indicates that the npn type cannot be practically used for the applications described earlier. The npn type inherently has a lower speed due to a large junction capacitance and carrier recombination in the base. Even if the area is extended to increase the dynamic range, this causes further increase in junction capacitance, decreasing the speed in such a extent that the npn type becomes totally impractical. Thus the MOS transistor type of the present invention has a much superior characteristic both in gain and dynamic range. It has actually the highest performance for a device using Si for either of the applications of charged particles detection, optical imaging, optical communications (baseband transmission, carrier transmission, fiber transmission, free-space optical transmission).

As has been described above, according to the present invention, by constructing the device element of a MOS transistor having a substrate back bias, a semiconductor detector of light or radiation having a higher speed and a lower power consumption than ever existed is accomplished.

The description has been done so far for the examples using a p-channel MOS transistor. Naturally an n-channel MOS transistor may also be used, since the essential part is the same despite some change in constant in the formula (change in carrier mobility and so on changes due to the different conductivity type). In that case, the n-well type, the substrate type, the power supply and so on need to be constructed using the opposite conductivity type and the opposite power supply (Vdd, Vss) system. This is so self-evident that the description is omitted for this. We used the examples of PMOS because PMOS has a smaller Ids than NMOS for the same dimensions (such as L/W and gate Tox), allowing to reduce the power consumption.

FIELD OF APPLICATION IN THE INDUSTRY

As has been described above, according to the present invention, by constructing the device element with a PMOS transistor having a substrate back bias, a semiconductor detector of light or radiation with a high speed and a low power consumption is accomplished.

We claim:

1. A method of manufacturing a semiconductor detector for detecting light and radiation, the method comprising the steps of: providing a first semiconductor substrate of a first conductivity type having a first surface and a second surface opposite the first surface; forming an impurity region of a second conductivity type in the first surface of the first semiconductor substrate; oxidizing and diffusing the impurity region in the first surface of the first semiconductor substrate; thereafter attaching a second substrate to the first surface of the first semiconductor substrate; grinding the first semiconductor substrate from the second surface thereof to a predetermined thickness; forming a MOS transistor on the ground second surface of the first semiconductor substrate; removing the second substrate; and forming electrodes in the impurity region formed in the first surface of the first semiconductor substrate.

2. A method of manufacturing a semiconductor detector according to claim 1; wherein the step of forming the impurity region of the second conductivity type in the first surface of the first semiconductor substrate comprises ion implantation of $BF_{2\ or\ BF3}$ ions with a dose amount of $5E14/cm^2$ and at an acceleration energy of 40 KeV to 80 keV.

3. A method of manufacturing a semiconductor detector for detecting light and radiation, the method comprising the steps of: providing a first semiconductor substrate of a first conductivity type; attaching a second substrate to the first semiconductor substrate through an insulating film; grinding the first semiconductor substrate from a surface thereof to a predetermined thickness; forming a MOS on the ground surface of the first semiconductor substrate; removing the second substrate; and forming electrodes of a MOS diode on the first semiconductor substrate for forming a depletion layer.

4. A method of manufacturing a semiconductor detector comprising the steps of: providing a first substrate having a first surface and a second surface opposite the first surface; forming an impurity region in the first surface of the first substrate; attaching a second substrate to the first surface of the first substrate; grinding the first substrate from the second surface thereof to a predetermined thickness; forming a MOS transistor on the ground second surface of the first substrate; removing the second substrate; and forming electrodes in the impurity region formed in the first surface of the first substrate.

5. A method of manufacturing a semiconductor detector according to claim 4; wherein the step of forming the impurity region comprises implanting ions of $BF_{2\ or\ BF3}$ with a dose amount of $5E14/cm^2$ and at an acceleration energy of 40 KeV to 80 keV into the first surface of the first substrate.

6. A method of manufacturing a semiconductor detector comprising the steps of: providing a first substrate having a first surface and a second surface opposite the first surface; disposing an insulating film on the first surface of the first substrate; attaching a second substrate to the first substrate through the insulating film; grinding the first substrate from the second surface thereof to a predetermined thickness; thereafter forming a MOS transistor on the second surface of the first substrate; removing the second substrate; and forming electrodes on the first surface of the first substrate.

* * * * *